(12) United States Patent
Takatsuki

(10) Patent No.: US 7,043,707 B2
(45) Date of Patent: May 9, 2006

(54) SIMULATION RESULT VERIFICATION METHOD AND SIMULATION RESULT VERIFICATION DEVICE

(75) Inventor: Naohisa Takatsuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 171 days.

(21) Appl. No.: 10/455,308

(22) Filed: Jun. 6, 2003

(65) Prior Publication Data

US 2003/0229872 A1    Dec. 11, 2003

(30) Foreign Application Priority Data

Jun. 7, 2002    (JP)    ............................. 2002-167264

(51) Int. Cl.
*G06F 17/50*    (2006.01)
*G06F 9/45*    (2006.01)

(52) U.S. Cl. ........................ 716/6; 716/1; 716/4; 716/5

(58) Field of Classification Search ................ 716/1–6
See application file for complete search history.

(56) References Cited

U.S. PATENT DOCUMENTS

| 6,473,881 | B1 * | 10/2002 | Lehner et al. ................... 716/2 |
| 6,694,495 | B1 * | 2/2004 | Hussain et al. ................ 716/4 |
| 2002/0133796 | A1 | 9/2002 | Oda |
| 2003/0217341 | A1 * | 11/2003 | Rajsuman et al. ............. 716/4 |
| 2004/0139406 | A1 * | 7/2004 | Kasapi .......................... 716/4 |
| 2004/0210861 | A1 * | 10/2004 | Kucukcakar et al. .......... 716/6 |

* cited by examiner

*Primary Examiner*—A. M. Thompson
*Assistant Examiner*—Magid Y. Dimyan
(74) *Attorney, Agent, or Firm*—McDermott Will & Emery LLP

(57) ABSTRACT

A simulation result verification method of the present invention compares a simulation result representing the relationship between the time and the output state at a given node, with condition information specifying the conditions for the output state of the given node over time, and evaluates the same. Accordingly, it is possible to determine whether the simulation result and the condition information agree with each other and it is not necessary to visually verify the relationship between the simulation result and the threshold value, thereby shortening the verification time and reducing possible errors in visual verification to a low level.

3 Claims, 20 Drawing Sheets

FIG. 6

RESULT FILE

| NODE | TIME | VOLTAGE |
|------|------|---------|
| Z    | 10   | 2.2     |
| ...  | ...  | ...     |
| Z    | 20   | 3.7     |
| ...  | ...  | ...     |
| Z    | 30   | 4.4     |
| ...  | ...  | ...     |
| Z    | 40   | 4.8     |
| ...  | ...  | ...     |
| Z    | 50   | 5       |
| ...  | ...  | ...     |
| Z    | 60   | 5       |

SIMULATION RESULT VERIFICATION METHOD AND SIMULATION RESULT VERIFICATION DEVICE

BACKGROUND OF THE INVENTION

The present invention relates to a simulation result verification device for performing simulations of semiconductor integrated circuits and verifying the semiconductor integrated circuits from the obtained simulation result.

Recently, there is a demand for high-precision circuit designs for realizing high-performance, highly integrated LSIs, and circuit simulators are playing a key role in such high-precision circuit designs. A circuit simulator performs simulation of LSIs that are to be actually manufactured, based on a netlist representing the circuit information.

FIG. 1 shows a conventional simulation of LSIs. Various kinds of data including a netlist 106, an input vector file 107, a threshold value setting file 108 and a process parameter library 109 are input into a circuit simulator 110. The netlist 106 includes data, which is generated by a netlist output tool 103, on a transistor model library 101 containing the elements necessary for the circuit configuration. FIG. 2A shows the transistor model library 101, which corresponds to transistors and inverters. As shown in FIG. 2B, the input vector file 107 describes the voltages that are input to the input nodes of the circuit at predetermined periods. As shown in FIG. 2C, the threshold value setting file 108 sets threshold values for the nodes to be verified, converting the simulation result into a logic value that is easy to be understood visually. The process parameter library 109 contains files that take the process variations of the elements, such as a transistor, into account.

The circuit simulator 110 outputs a simulation result. A waveform viewer 112 reads and displays the simulation result. FIG. 3 shows a screen of the waveform viewer 112. The waveforms of the input nodes of the circuit are denoted by I/O[0] and I/O[1], and the waveforms of the intermediate nodes are denoted by WL[0] and SL[0]. The waveform viewer shown in FIG. 3 displays the simulation result represented by numeral 301 and a logic value 302 obtained by converting the simulation result into the threshold value. In FIG. 1, numerals 113, 114 and 115 denote the steps of visually verifying the circuit with regard to the displayed contents of the waveform viewer 112, and numeral 116 denotes the completion of the visual verification of the circuit. Numeral 117 denotes a retry when the threshold value settings by the threshold value setting file 108 were improper or when new threshold values are set for the intermediate nodes.

However, there has been the following problem in the prior art.

In the waveform viewer shown in FIG. 3, the set threshold value merely converts the simulation result 301 into the logic value 302, and whether the simulation result 301 is the desired result at time $t_1$ to $t_2$ at a given node can only be confirmed by visual inspection.

SUMMARY OF THE INVENTION

Therefore, with the foregoing in mind, it is an object of the present invention to make it possible to compare a simulation result showing the relationship between the time and the output state at a given node, with condition information specifying the conditions for the output state of the given node over time, and to evaluate the same.

According to a simulation result verification method of the present invention that solves the above-described problem, based on a simulation result that is obtained by simulating a semiconductor integrated circuit and that represents a relationship between a time and an output state at each of a plurality of nodes of the semiconductor integrated circuit, and condition information specifying a condition for an output state in a period between times $t_1$ and $t_2$ of one of the nodes, it is determined whether the output state in the period between the times $t_1$ and $t_2$ of the one node in the simulation results agrees with the output state according to the condition information.

Thus, it is possible to determine whether the simulation result and the condition information agree with each other and it is not necessary to visually verify the relationship between the simulation result and the threshold value, thereby shortening the verification time and reducing possible errors in visual verification to a low level.

According to another simulation result verification method of the present invention that solves the above-described problem, the voltage at a given time t in the simulation result is determined by estimating the voltage at the time t from the change between times $t_a$ and $t_b$, which are actually present in the simulation result and are the closest times before and after the time t, thereby making it possible to determine voltage V at time $t_1$ and time $t_2$ even when time t is not actually present in the simulation result.

According to another simulation result verification method of the present invention that solves the above-described problem, time T of the simulation result is retrieved successively, the time t is held as time information $t_a$ and a voltage at the time t is held as voltage information $V_a$ when T is not greater than time t, and the time t is held as time information $t_b$ and a voltage at the time t is held as voltage information $V_b$ when T is greater than the t. Then, by using a computer, $t_a$, $t_b$, $V_a$ and $V_b$ can be obtained, and voltage V at a given time t can be determined.

According to another simulation result verification method of the present invention that solves the above-described problem, the approximate value of a voltage at a given time t can be determined by using the approximation equation: $V=(V_b-V_a)/(t_b-t_a) \times t + V_a - (V_b-V_a)/(t_b-t_a) \times t_a$.

Further, a simulation result verification method according to the present invention is used when a given time t is not present in the simulation result and thus eliminates the need to determine the approximate value when a given time t and time T are the same, which makes it possible to obtain results promptly.

BRIEF DESCRIPTION OF THE DRAWINGS

FIG. 6 is a diagram showing a result file according to the present invention.

DETAILED DESCRIPTION OF THE INVENTION

Figure 1:
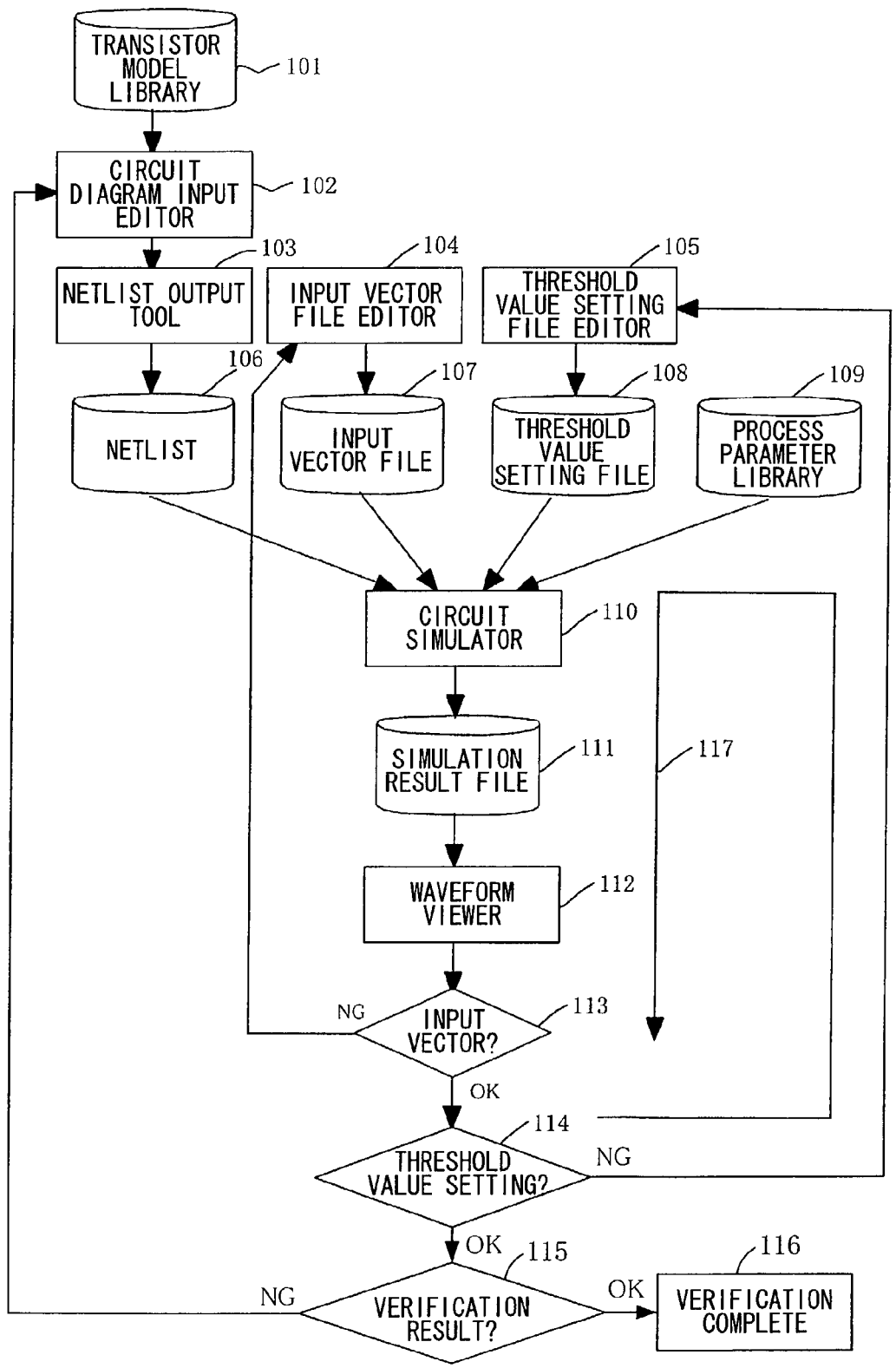
FIG. 1 is a block diagram showing the configuration of a conventional simulation result verification device.
Figure 2A:
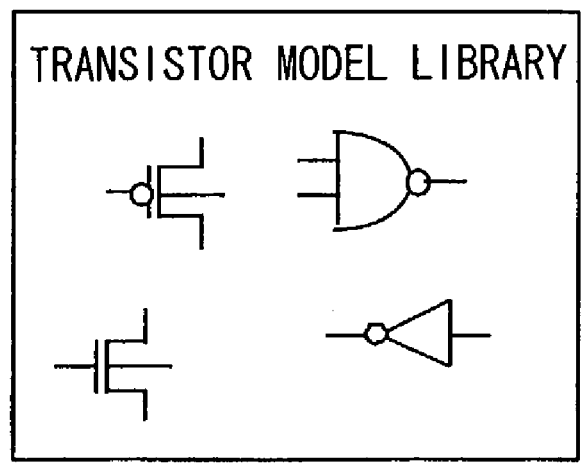
FIG. 2A is a diagram showing the contents of a transistor model library.
Figure 2B:
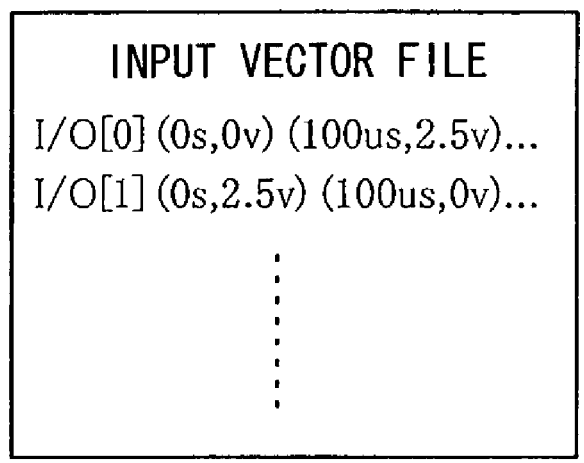
FIG. 2B is a diagram showing the contents of an input vector file.
Figure 2C:
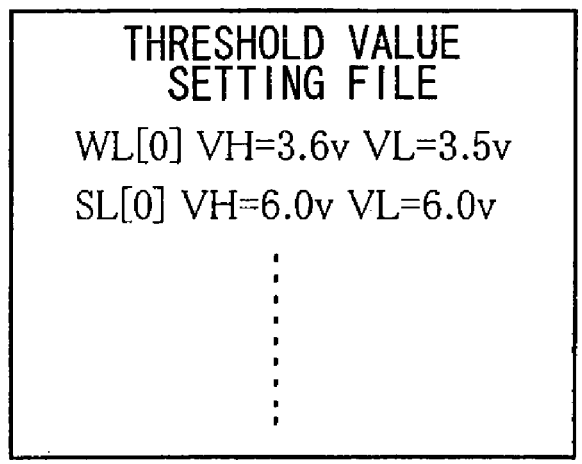
FIG. 2C is a diagram showing the contents of a threshold value setting file.
Figure 3:
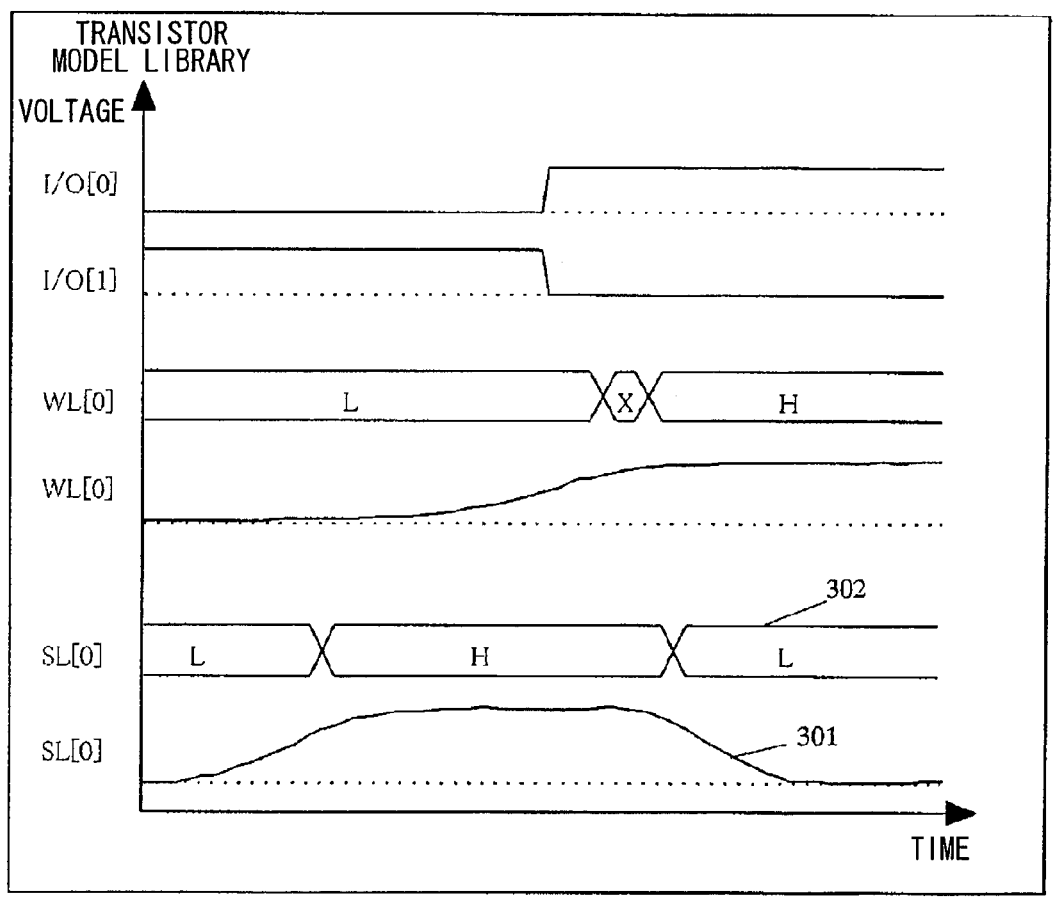
FIG. 3 is a graph showing the contents of the screen of a waveform viewer.

Hereinbelow, preferred embodiments of the present invention are described with reference to the appended drawings. Of the components described in the embodiments of the present invention, those that are the same as the components described in the prior art section are denoted by the identical reference numerals and the descriptions thereof have been omitted.

Embodiment 1

Figure 4:
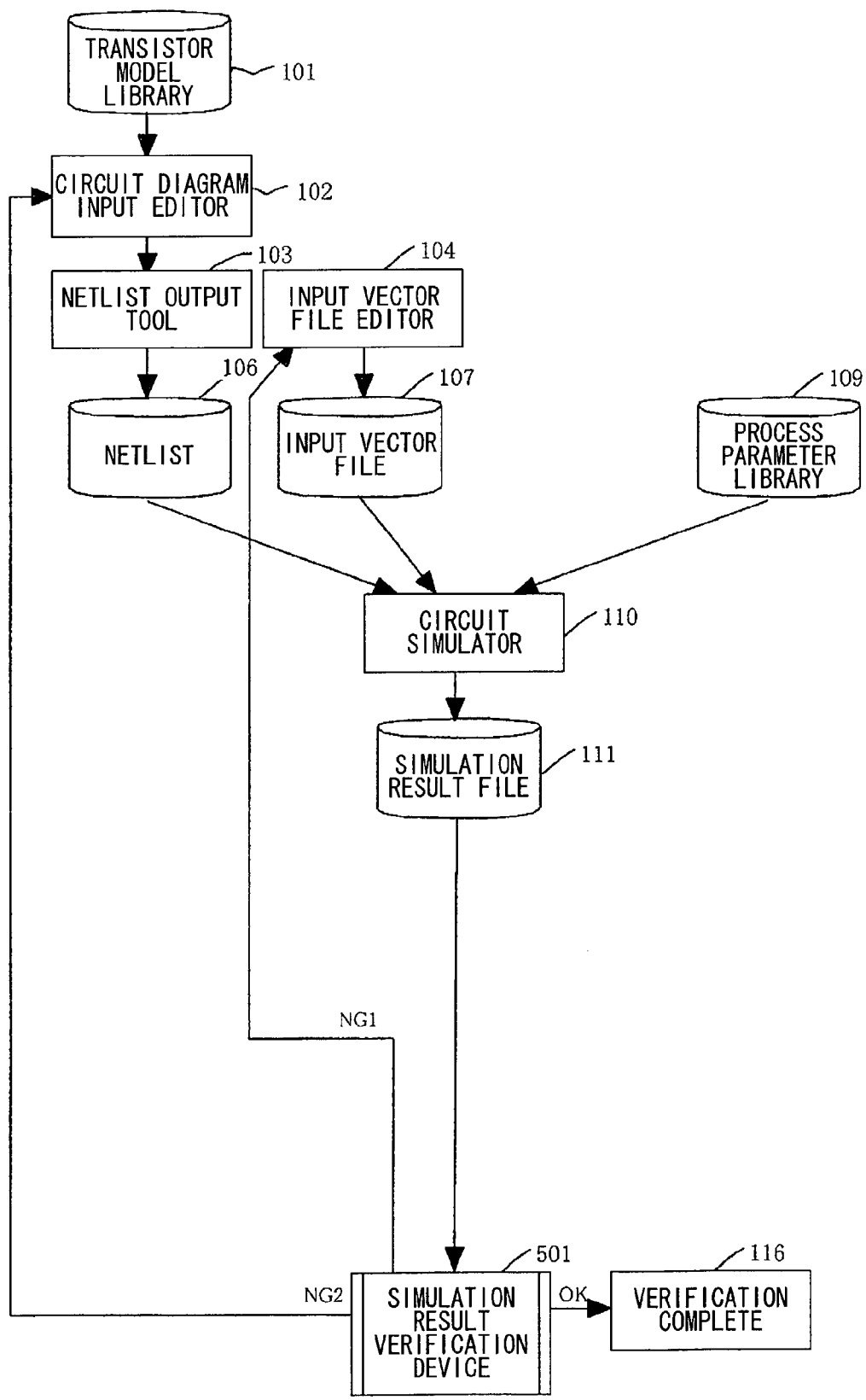
FIG. 4 is a block diagram showing the configuration of a simulation result verification device according to the present invention.

A simulation result verification method according to Embodiment 1 of the present invention for verifying a simulation result obtained by simulating a semiconductor integrated circuit is described with reference to drawings. As shown in FIG. 4, numeral 101 denotes a transistor model library, 102 denotes a circuit diagram input editor, 103 denotes a netlist output tool, 104 denotes an input vector file editor, 106 denotes a netlist, 107 denotes an input vector file, 109 denotes a process parameter library, 110 denotes a circuit simulator, 111 denotes a simulation result file and 116 denotes the completion of a visual verification of the circuit. This configuration is the same as that of the conventional example.

Figure 5:
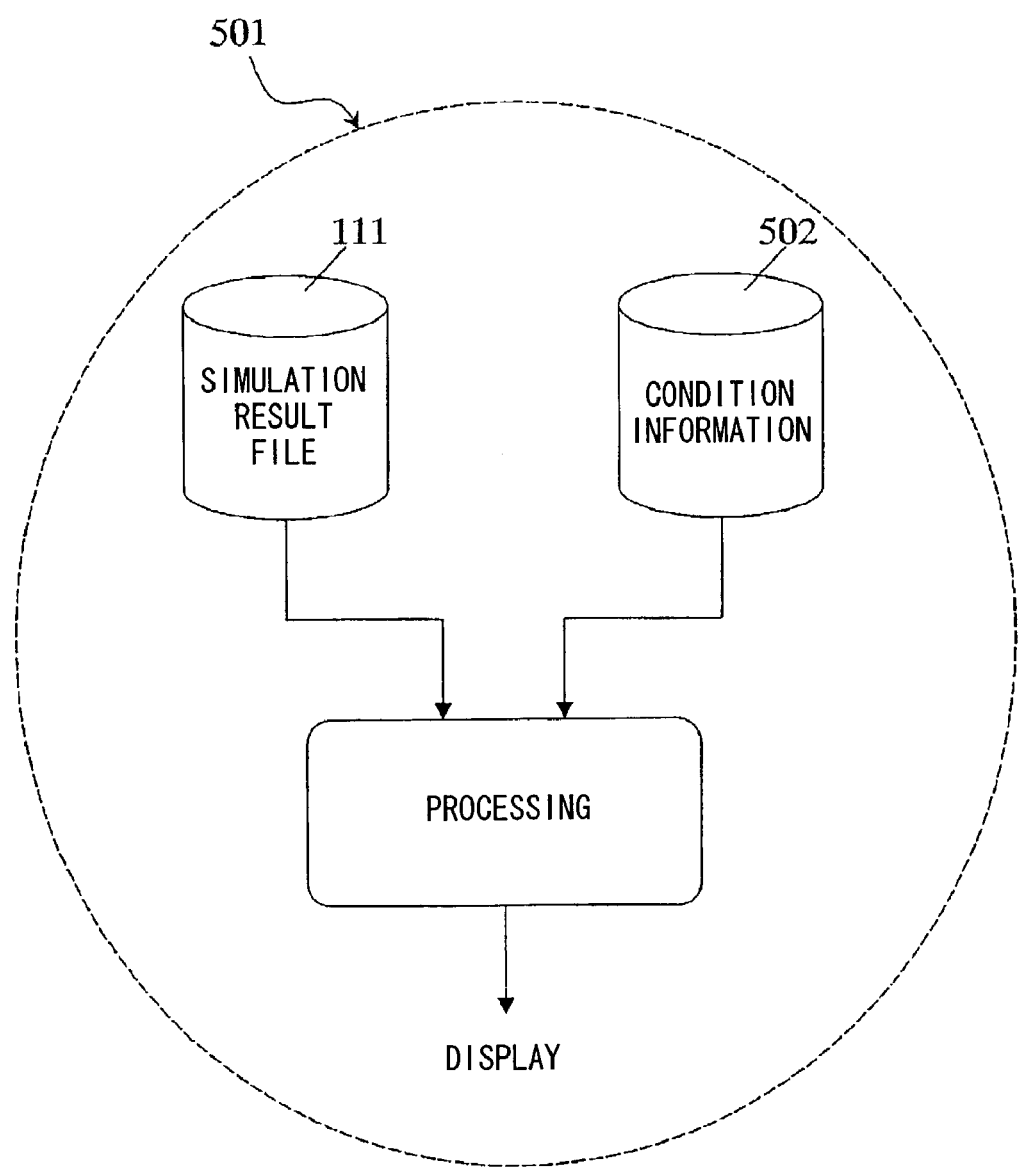
FIG. 5 is a diagram showing the simulation result verification device according to the present invention.

Numeral 501 denotes a simulation result verification device, whose configuration is shown in FIG. 5. The simulation result verification device 501 includes the simulation result file 111 and condition information 502, and it compares the simulation result file 111 with the condition information 502 and displays whether they agree with each other. The result file 111 is a result obtained from the simulation with the circuit simulator 110, and includes, as output information, time information, voltage information, current information and node names. FIG. 6 shows the contents of the simulation result file 111. As shown in the figure, the simulation result file includes pairs of time information and voltage information for a given node.

Figure 7:
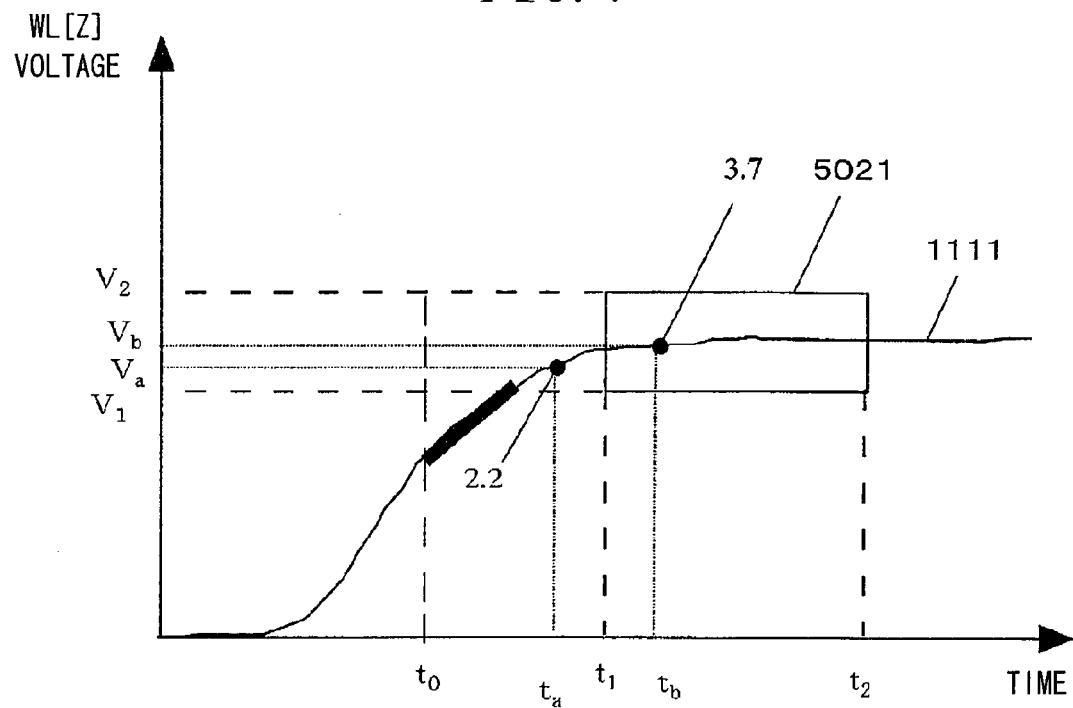
FIG. 7 is a graph showing a comparison of a simulation result with condition information.

FIG. 7 is a graph showing a specific comparison of the simulation result file 111 with the condition information 502. The time and the voltage are plotted on the horizontal axis and the vertical axis, respectively, and the simulation result file 111 is shown as 1111. Here, when the time of the condition information 502 is set to time $t_1$–$t_2$ and the voltage of the condition information 502 is set to voltages $V_1$–$V_2$, the range of the condition information 502 is represented by a square figure as 5021. If all of the voltages V of the simulation result file 111 are included within the range of the condition information 502 represented by the square figure at time $t_1$14 $t_2$ as the result of inputting the above-described conditions, then it is determined that the simulation result file 111 and the condition information 502 satisfy the conditions. That is, if the relation $V_1 \leq V \leq V_2$ holds in the period between time $t_1$ and time $t_2$, it is determined that the simulation result file 111 and the condition information 502 satisfy the conditions.

Conversely, if any one of the voltages V of the simulation result file 111 is not included within the range of the condition information 502 represented by the square figure from time $t_1$ to $t_2$, it is determined that the simulation result file 111 and the condition information 502 do not satisfy the conditions. That is, when the relation $V_1 \leq V \leq V_2$ does not hold in the period between time $t_1$ and time $t_2$ for any data point of the simulation result file 111, it is determined that the simulation result file 111 and the condition information 502 do not satisfy the conditions.

Although the time of the condition information 502 is set to time $t_1$–$t_2$, there may be no simulation result corresponding to the setting. That is, there may be no simulation result at $t_1$ or $t_2$. In that case, the value of $t_1$ or $t_2$ of the simulation result file 111 does not exist, so that it is impossible to determine whether the simulation result file 111 and the condition information 502 agree with each other. Accordingly, in this case, the approximate value of the voltage V at the times $t_1$ and $t_2$ is determined by using an approximation equation. This is explained below.

Figure 8:
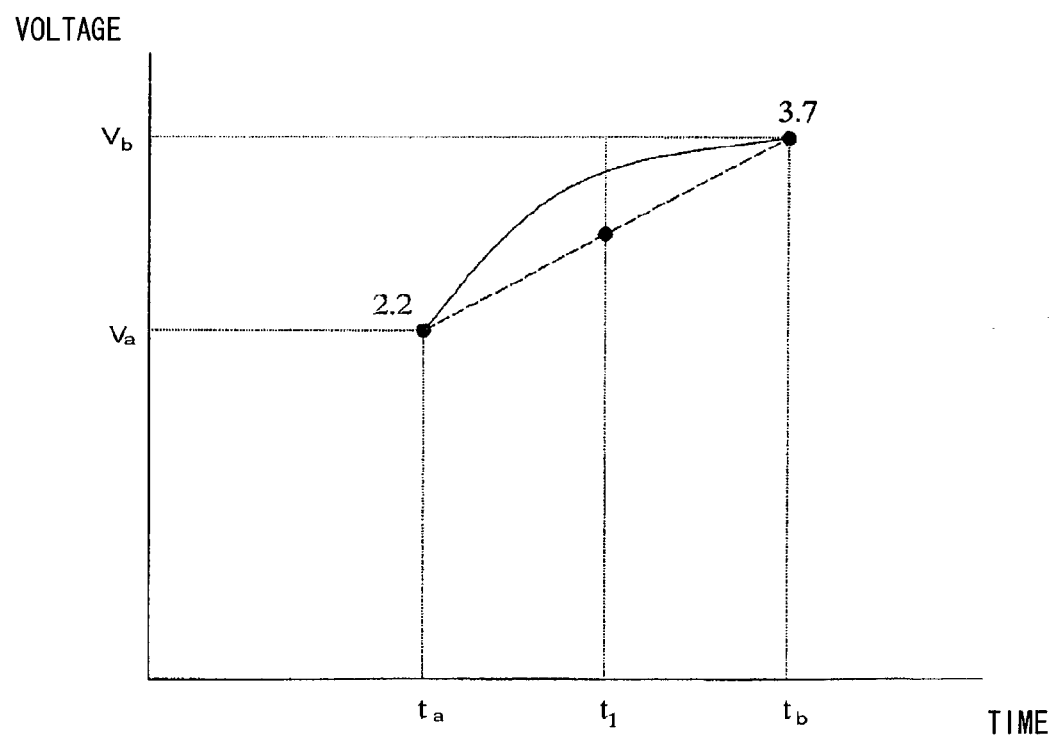
FIG. 8 is an enlarged view of the FIG. 7.

FIG. 8 shows an enlarged partial view of FIG. 7. This flow chart is applied to time $t_1$. When time $t_1$ is not present in the simulation result file 111, the voltage of a given time t in the simulation result is determined by estimating it from the change between times $t_a$ and $t_b$, which are actually present in the simulation result and are the closest times before and after the time t.

Here, the method for determining $t_a$, $t_b$, $V_a$ and $V_b$ is described with reference to the flow chart shown in FIG. 9. Time T of the simulation result is retrieved successively (S910), and when time T is not greater than time $t_1$ (S911), time $t_a$ is set to time T and $V_a$ is set to the voltage at time $t_a$ (S912). Then, the next time T that is greater than time $t_a$ is retrieved (S910). When the next time T is retrieved, $t_a$ is updated to the next time T and $V_a$ is updated to the voltage at $t_a$ (S912). Then, a T that is even greater is retrieved (S910). In this manner, time T is retrieved successively (S910), and $t_a$ is set to the time T and $V_a$ is set to the voltage at $t_a$ (S910).

Then, the next T is retrieved (S910), and when time T is greater than $t_1$ (S911), $t_b$ is set to that time T and $V_b$ is set to the voltage at $t_b$ (S913). In this manner, $t_a$, $t_b$, $V_a$ and $V_b$ are determined, and the following equation: $V=(V_b-V_a)/(t_b-t_a) \times T+V_a-(V_b-V_a)/(t_b-t_a) \times t_a$ is used (S914) to determine the approximate value of voltage V at a given time t. Here, taking the values of $t_a$ and $t_b$ using a computer makes it possible to determine the approximate value of voltage V at time $t_1$ from $t_a$, which is smaller than $t_1$ and closest to $t_1$, from $t_b$, which is greater than $t_1$ and closest to $t_1$, from voltage $V_a$ at $t_a$ and from voltage $V_b$ at $t_b$, even when time $t_1$ does not exist. More specifically, the approximate value is determined by the first-order approximation with a straight line between the two points $t_a$ and $t_b$.

Figure 9:
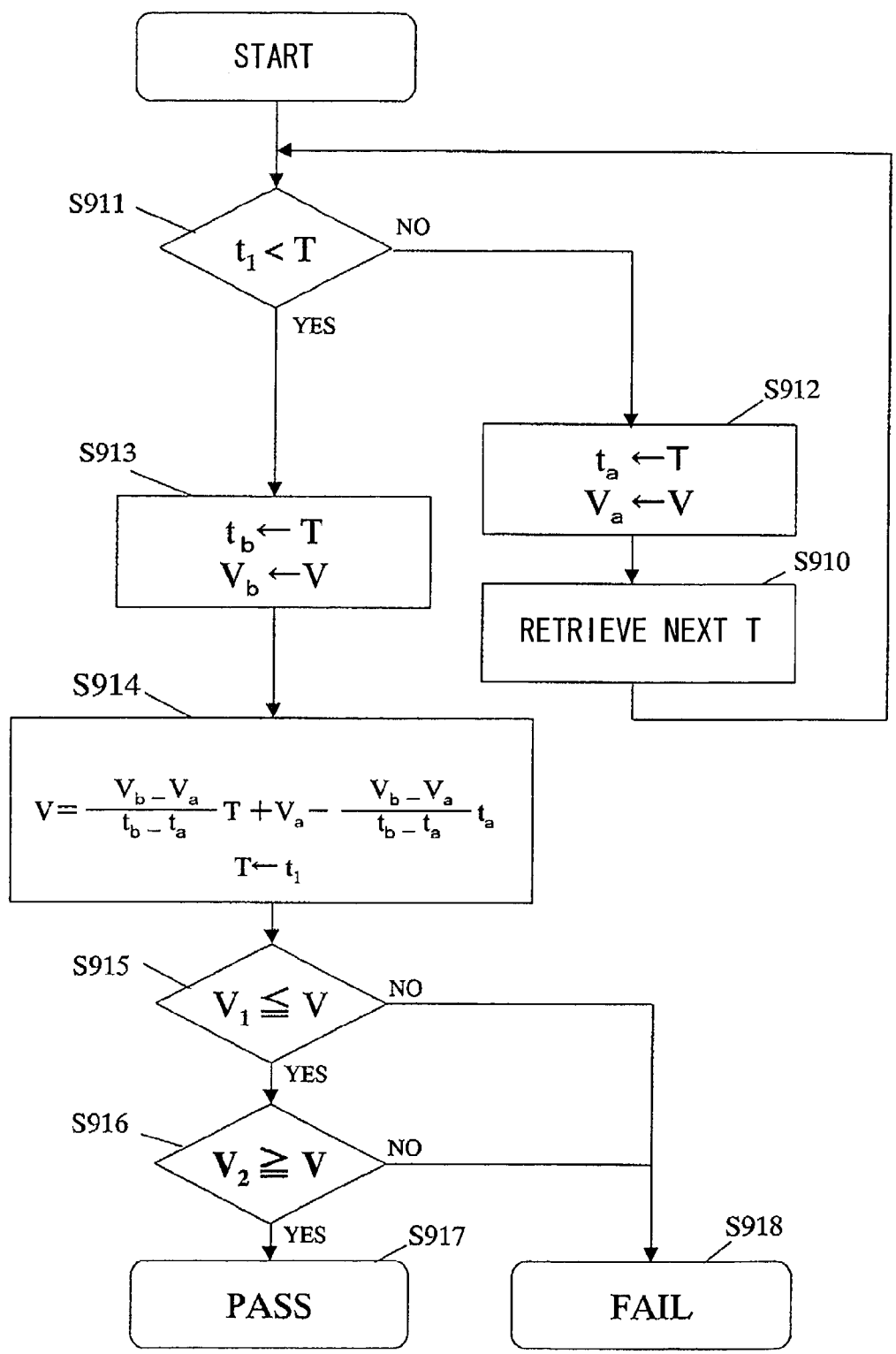
FIG. 9 is a flow chart showing Embodiment 1 of the present invention.

Then, as shown in FIG. 9, it is determined whether the obtained V is greater than $V_1$ of the predetermined condition information, that is, whether $V_1 \leq V$ is satisfied (S915). Here, when it is determined that $V_1 \leq V$ is not satisfied, the conditions are not met, so that it is determined that the simulation result file 111 and the condition information 502 do not satisfy the conditions (S918). When $V_1 \leq V$ is satisfied (S915), V is further compared with $V_2$ determined by the condition information (S916). When it is determined that $V_2 \leq V$ is not satisfied, the condition are not met, so that it is determined that the simulation result file 111 and the condition information 502 do not satisfy the conditions (S918). When it is determined that $V_2 \leq V$ is satisfied (916), it is determined that the simulation result file 111 and the condition information 502 satisfy the conditions (S917).

Figure 10:
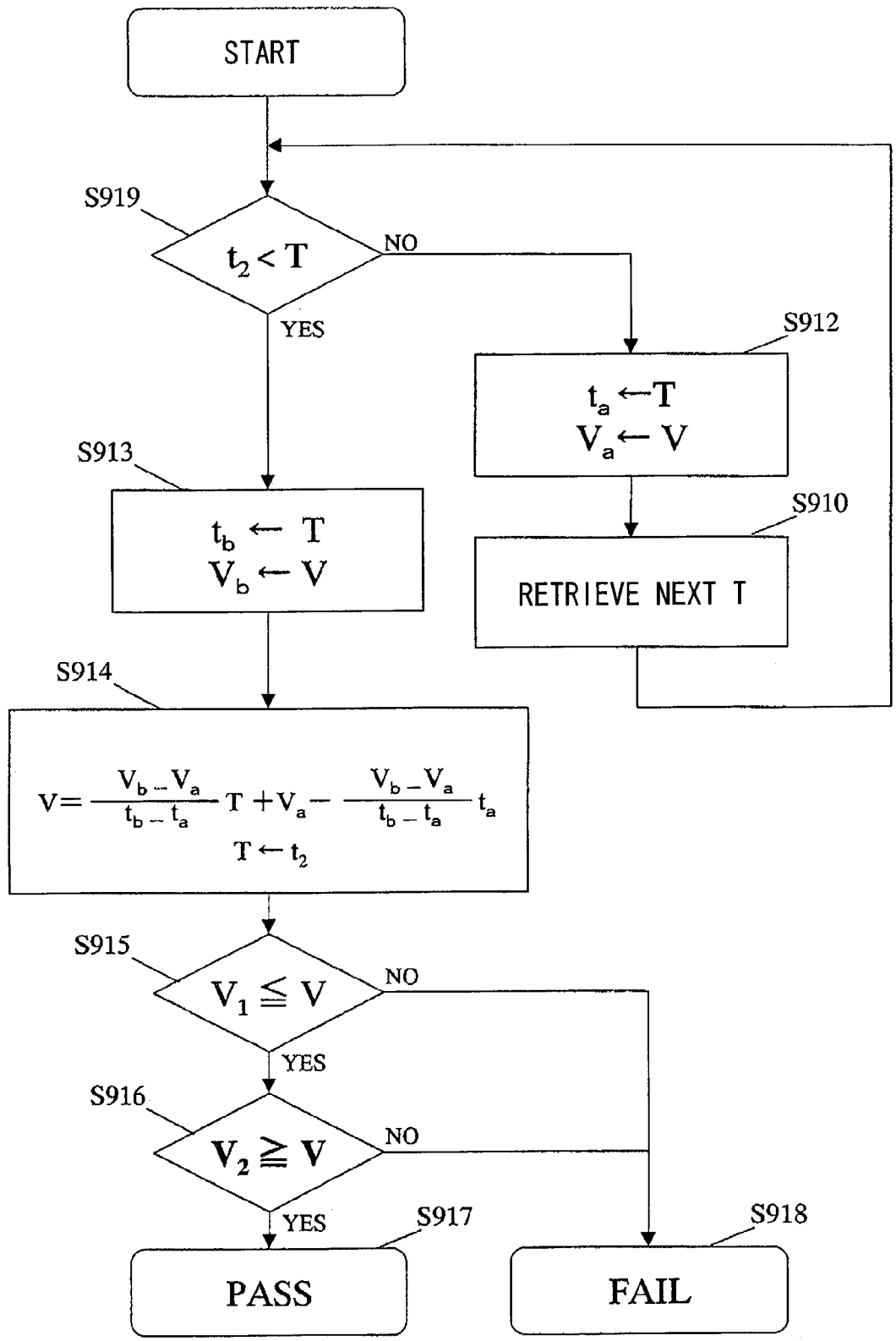
FIG. 10 is a flow chart showing Embodiment 1 of the present invention.

Next, the method for determining $t_a$, $t_b$, $V_a$ and $V_b$ at time $t_2$ set in the condition information is described with reference to the flow chart shown in FIG. 10. The method is basically the same as that used for $t_1$. Time T of the simulation result is retrieved successively (S910), and $t_a$ is set to time T and $V_a$ is set to the voltage at time $t_a$ (S912). Then, the next time T that is greater than $t_a$ is retrieved (S910). When the next time T is retrieved, $t_a$ is updated to the next time T and $V_a$ is updated to the voltage at $t_a$ (S912). Then, a time T that is even greater is retrieved (S910). In this manner, time T is retrieved successively and $t_a$ is set to that time T and $V_a$ is set to the voltage at $t_a$ (S912).

Then, the next time T is retrieved (S910), and when time T is greater than $t_2$ (S919), $t_b$ is set to the time T and $V_b$ is set to the voltage at $t_b$ (S913). In this manner, $t_a$, $t_b$, $V_a$ and $V_b$ are determined, and the following equation: $V=(V_b-V_a)/(t_b-t_a) \times T+V_a-(V_{b-Va})/(t_b-t_a) \times t_a$ is used (S914) to determine the approximate value of voltage V at a given time t. Then, as shown in FIG. 10, it is determined whether the obtained V is greater than $V_1$ of the predetermined condition information (S915). Here, when $V_1 \leq V$ is not satisfied, the conditions are not met, so that it is determined that the simulation result file 111 and the condition information 502 do not satisfy the conditions (S918). When $V_1 \leq V$ is satisfied, V is further compared with $V_2$ determined by the condition information (S916). When $V_2 \geq V$ is not satisfied, the conditions are not met, so that it is determined that the simulation result file 111 and the condition information 502 do not satisfy the conditions (S918). When it is found that $V_2 \geq V$ (S916), it is determined that the simulation result file 111 and the condition information 502 satisfy the conditions (S917).

Figure 11:
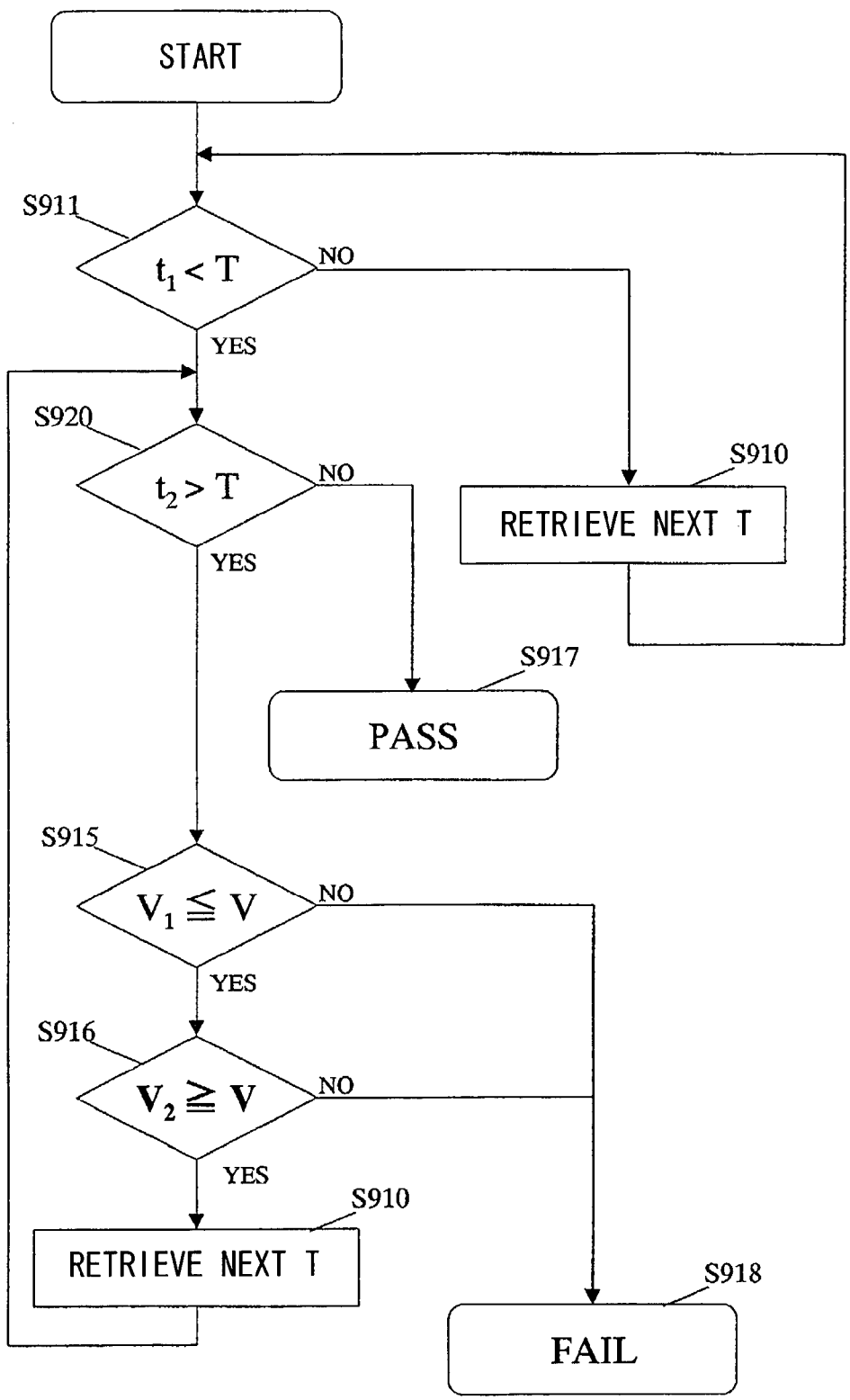
FIG. 11 is a flow chart showing Embodiment 1 of the present invention.

Next, it is examined whether the simulation result existing in the period between time $t_1$ and time $t_2$ satisfies $V_1 \leq V \leq V_2$ with regard to the voltages set in the condition information. This is shown in FIG. 11. Time T is retrieved (S910), and when $t_1 < T$ is not satisfied (S911), the next T is retrieved (S910), because time T is not included in the conditions to be tested. When time T satisfies $t_1 < T$ (S911), it is then compared with $t_2$ and it is determined whether time T satisfies $t_2 > T$ (S920). This is because time T satisfies the condition of step S911. Here, when time t satisfies $t_2 > T$ (S920), it is determined whether voltage V satisfies $V_1 \leq V$ (S915). When voltage V does not satisfy $V_1 \leq V$, it is determined that the simulation result file 111 and the condition information 502 do not satisfy the conditions (S918). When it is determined that $V_1 \leq V$ is satisfied (S915), V is compared with $V_2$ (S916). When $V_2 \geq V$ is not satisfied, it is determined that the simulation result file 111 and the condition information 502 do not satisfy the conditions (S918). When $V_2 \geq V$ is satisfied, the next T is retrieved (S910). In this manner, all of the points that are present between times $t_1$ and $t_2$ are examined, and when all of the points satisfy these conditions, the simulation result file 111 the condition information 502 agree with each other.

When it is determined that $t_2 > T$ is not satisfied (S920), it is determined that the simulation result file 111 and the condition information 502 satisfy the conditions (S917). The reason for this is that if it were determined that the simulation result file 111 and the condition information 502 do not satisfy the conditions, it would have been determined in the previous two steps that they do not satisfy the conditions. Accordingly, when $t_2 > T$ is not satisfied (S920), it is determined that simulation result file 111 and the condition information 502 satisfy the conditions.

While $t_1$ is retrieved first, $t_2$ is retrieved next and the time points in the period from $t_1$ to $t_2$ are retrieved last in this embodiment, the retrieval of $t_1$, $t_2$ and t that satisfies $t_1 < t < t_2$ may be performed in any order. However, it is effective to retrieve $t_1$ first, t that satisfies $t_1 < t < t_2$ next, and $t_2$ last. The reason for this is that for example, it is effective to perform the retrieval from the left in FIG. 7.

Figure 12:
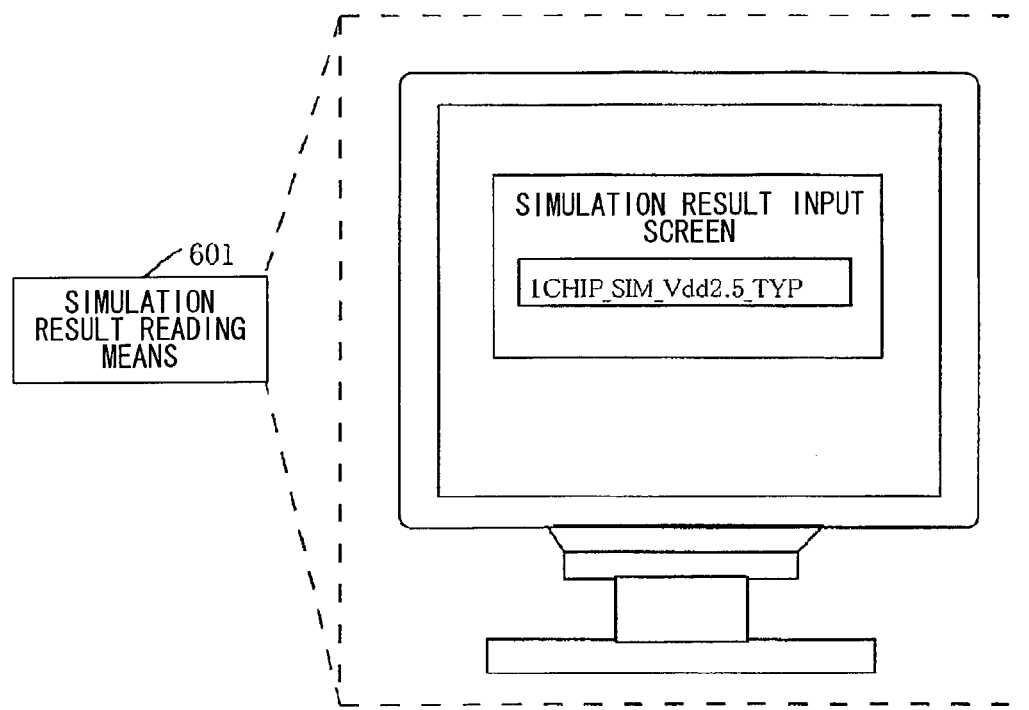
FIG. 12 is a diagram showing the contents of a simulation result input screen.

Additionally, as shown in FIG. 12, the present device may include simulation result reading means 601. This is the means for reading the simulation result file 111.

Figure 13:
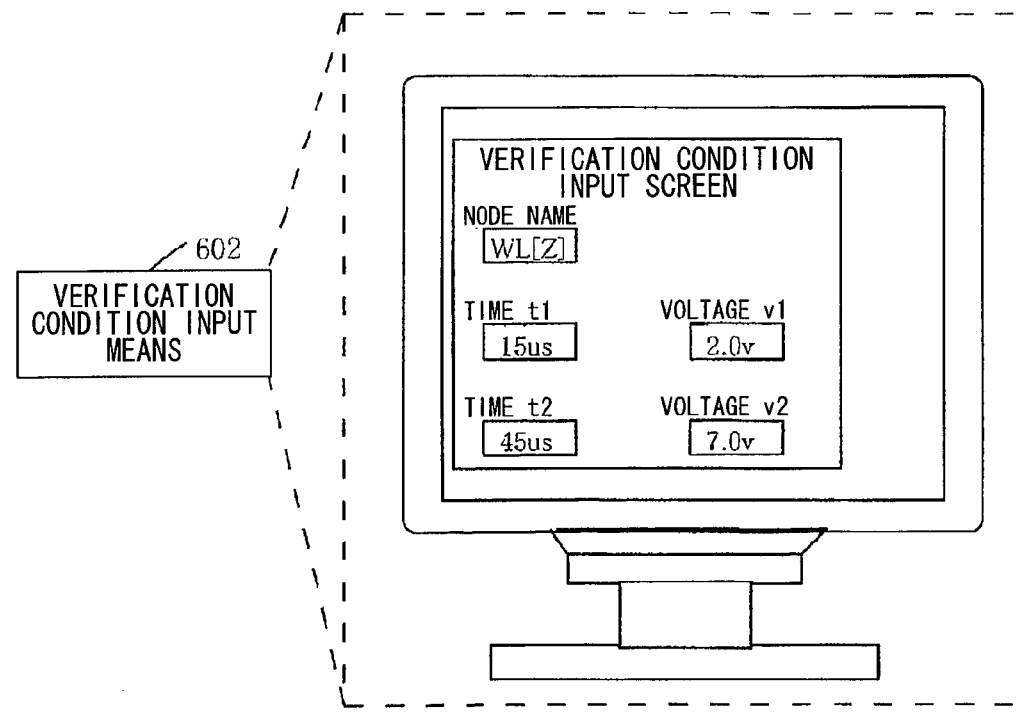
FIG. 13 is a diagram showing the contents of a verification condition input screen.

As shown in FIG. 13, the condition information 502 is determined by verification condition input means 602. As shown in the figure, an input screen for a verification condition is activated on the display. A node name, time $t_1$, time $t_2$, voltage $V_1$, voltage $V_2$ and the like are input. At this time, a current value may also be input. Based on the values input at this time, the square in FIG. 7 is determined. It should be noted that the node name can be designated a wildcard such as VL[*].

Figure 14:
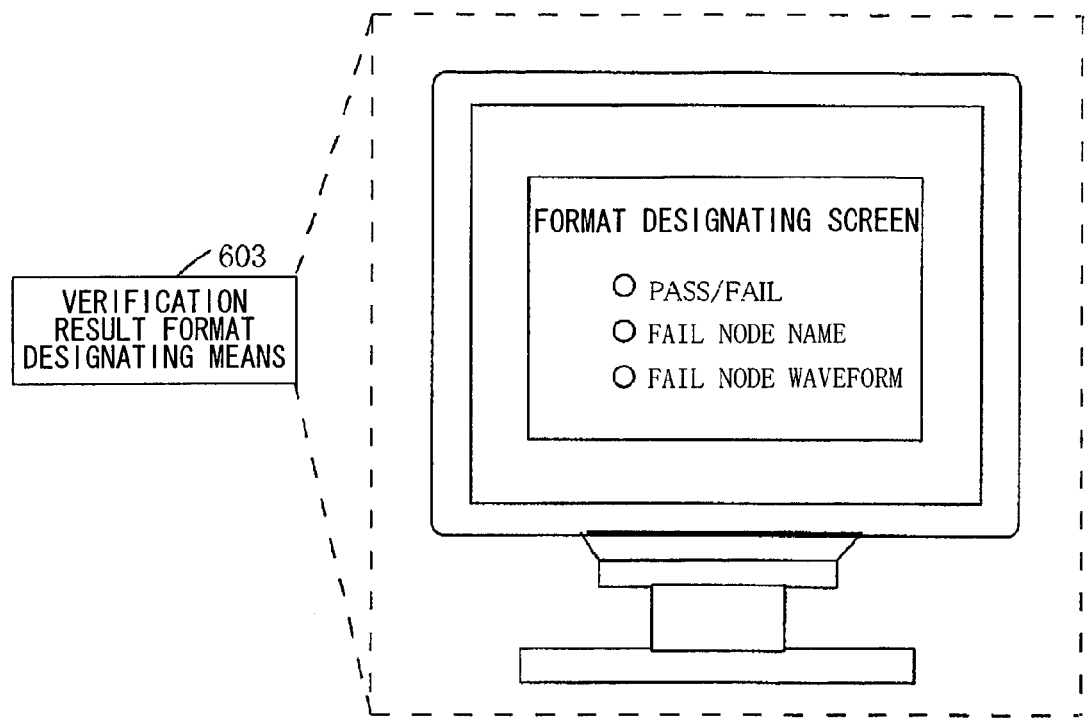
FIG. 14 is a diagram showing the contents of a format designation screen.

FIG. 14 shows verification result format designating means 603. As shown in the figure, a format designating screen is activated on the display. As the format, PASS/FAIL, FAIL node name or FAIL node waveform can be selected.

Figure 15:
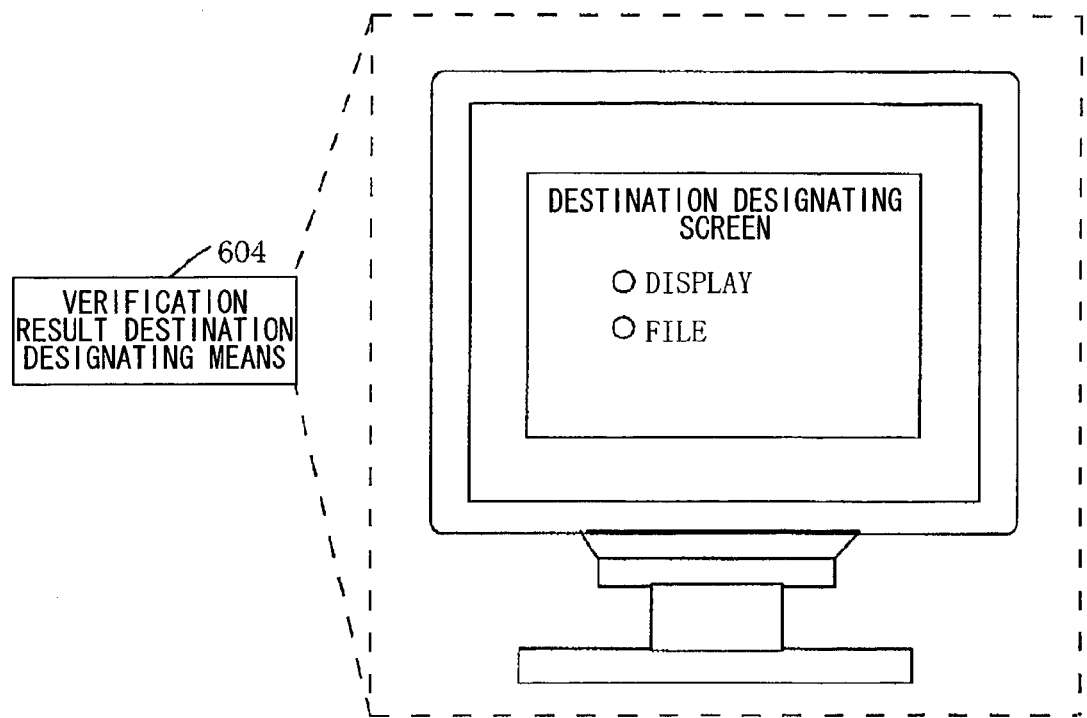
FIG. 15 is a diagram showing the contents of a destination designation screen

FIG. 15 shows verification result destination designating means 604. As shown in the figure, a destination designating screen is activated on the display. Either display or file can be selected.

Figure 16:
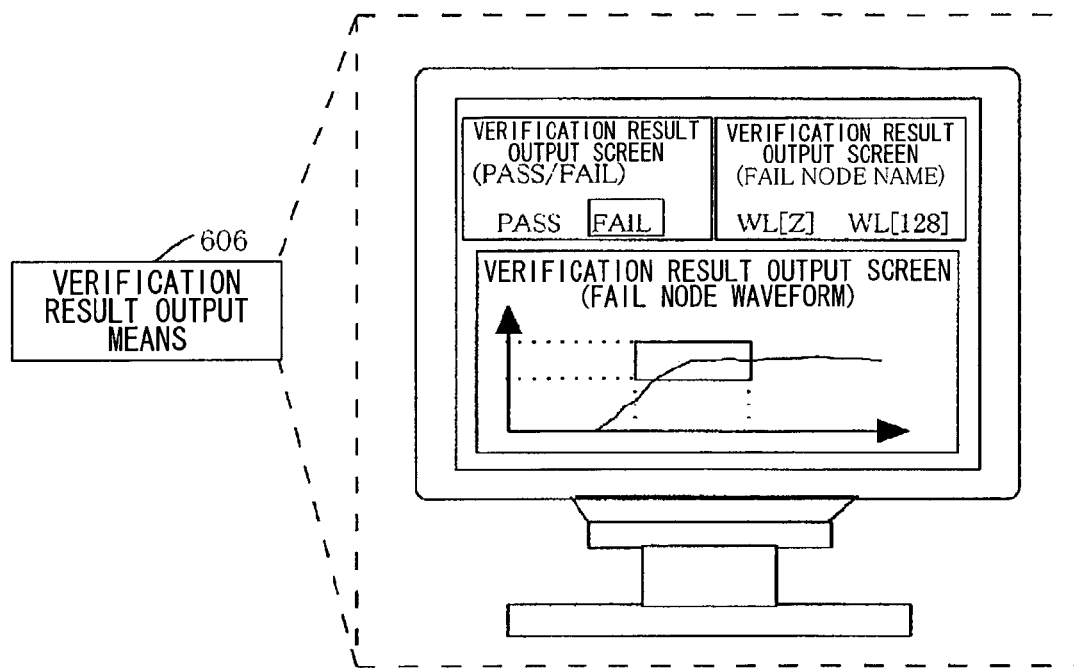
FIG. 16 is a diagram showing the contents of a verification result output screen.

FIG. 16 shows verification result output means 606. As shown in the figure, when a display is selected with the verification result destination designating means 604, a verification result output screen corresponding to the previous selection of PASS/FAIL, FAIL node name and FAIL node waveform with the verification result format designating means 603 is shown on the display. Here, let us consider a case where any error point of the FAIL node waveform is highlighted as a bold line. In this case, it is assumed that the time of the condition information is $t_0$ to $t_2$. As shown in FIG. 7, it is advantageous to highlight the error points of the FAIL node waveform as a bold line in that the error points can be readily understood visually.

In Embodiment 1, time T of the simulation result is retrieved successively, and when T is not greater than time t, time t is held or stored as time information $t_a$ and the voltage at time t is held as voltage information $V_a$. When T is greater than the above-mentioned t, time t is held as time information $t_b$ and the voltage at time t is held as voltage information $V_b$. Accordingly, it is possible to determine the voltage at a given time t from $t_a$, $t_b$, $V_a$ and $V_b$ by actually utilizing a computer. Therefore, it is possible to compare a simulation result representing the relationship between the time and the output state at a given node with a condition information designating conditions for the output state of the given node over time and to evaluate the same, thereby shortening the verification time and preventing errors in visual verification.

Figure 17:
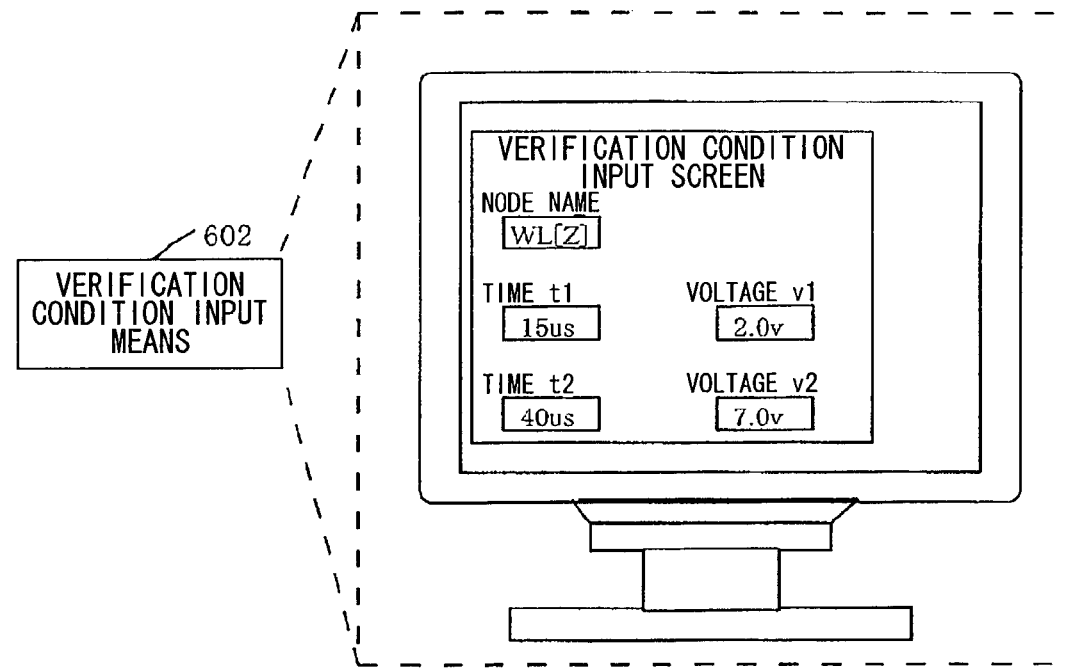
FIG. 17 is a diagram showing the contents of a verification condition input screen.

Next, this embodiment is described more specifically by giving actual values. First, let us examine the verification condition input means 602 for inputting the condition information. This is shown in FIG. 17. The node name is input as WL [Z], time $t_1$ as 15 μs, time $t_2$ as 40 μs, voltage $V_1$ as 2.0 and voltage $V_2$ as 7.0. This is explained in more detail in FIG. 18. The previously input time and voltage information are indicated as 5021. The node of the result file 111 shown in FIG. 6 is designated as Z. Here, the nodes other than Z have been omitted in FIG. 6. Although the various nodes each have output information such as time and voltage, these have been omitted. The result file 111 for the node Z is indicated as 1111 in FIG. 18.

Figure 18:
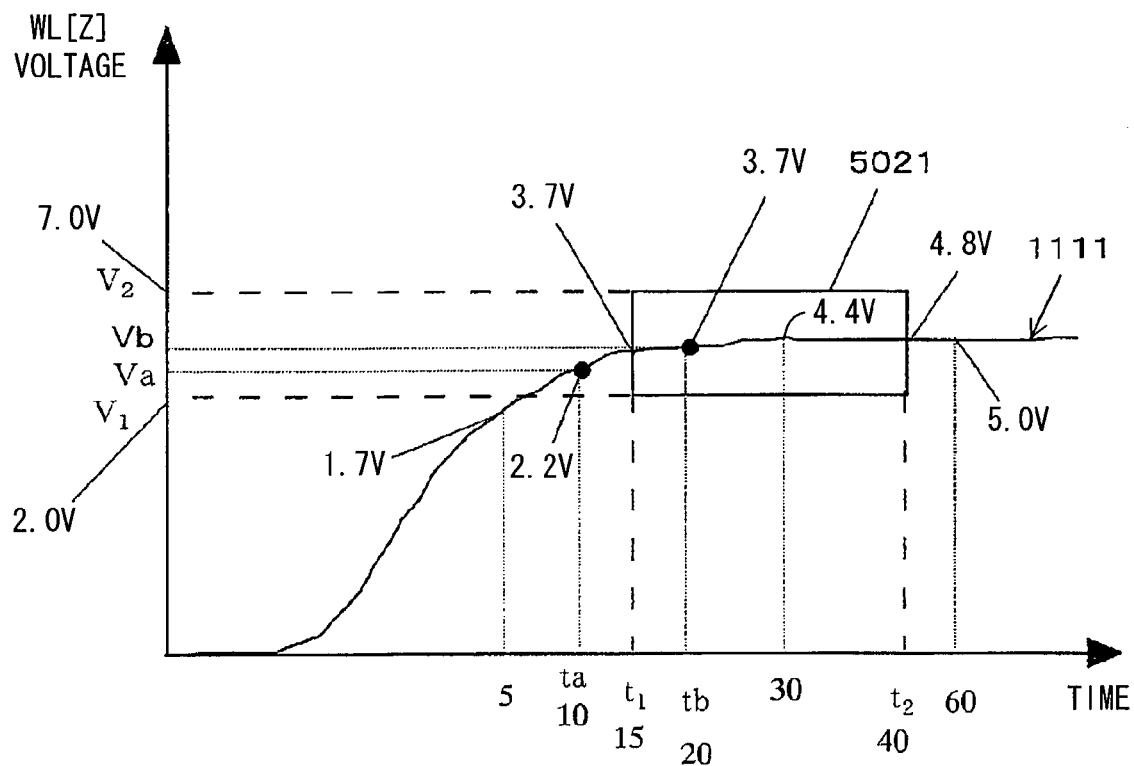
FIG. 18 is a graph showing a comparison of a simulation result with condition information.

Here, a consideration is made based on FIG. 9 and FIG. 18. T is retrieved successively (S910). When T is 5, it results in 15<5, and $t_1$<5 is not satisfied, so that $t_a$ is set to $t_a$=5 and $V_a$ is set to $V_a$=1.7 (not shown in FIG. 6) (S912). Then, the next T is retrieved (S910). The next T is 10. When T is 10, it results in 15<10, and $t_1$<10 is not satisfied, so that $t_a$ is set to $t_a$=10 and $V_a$ is set to $V_a$=2.2 from FIG. 6 (S912). Then, the next T is retrieved (S910). The next T is 20. Since T is 20, it results in 15<20, and the equation $t_1$<20 is satisfied, so that $t_b$ is set to $t_b$=20 and $V_b$ is set to $V_b$=3.7 (S914).

From the thus obtained $t_a$=10, $V_a$=2.2, $t_b$=20 and $V_b$=3.7, and the equation $V=(V_b-V_a)/(t_b-t_a) \times T + V_a - (V_b-V_a)/(t_b-t_a) \times t_a$, V is determined. That is, taking the point $t_1$=15 as a reference point, the approximate value is obtained from the two points $t_a$=10 and $t_b$=20, which are the two points before and after the reference point. Thus, V at the point $t_1$=15, which is included in the period from $t_a$=10 to $t_b$=20, can be determined from the points $t_a$ and $t_b$, which are actually present in the simulation result and closest to $t_1$. Thus, V can be calculated with the above equation to be V=2.95.

It is determined whether the thus determined V=2.95 satisfies the relationship $V_1 \leq V$ for the voltage $V_1$=2.0 (S915). Since 2.95 is greater than 2.0, the relationship $V_1 \leq V$ is satisfied. Accordingly, V is then compared with $V_2$, and it is determined whether V satisfies the relationship $V_2 \geq V$ (S916). Since voltage $V_2$=7.0, the relationship $V_2 \geq V$ is satisfied. Therefore, it is determined that the simulation result file 111 and the condition information 502 satisfy the conditions (S917).

Next, the same operations are performed for $t_2$. A consideration is made based on FIG. 10. T is retrieved successively (S910). When T is 30, it results in 40<30, and $t_2$<30 is not satisfied, so that $t_a$ is set to $t_a$=30 and $V_a$ is set to $V_a$=4.4 from FIG. 6 (S912). The next T is retrieved (S910). The next T is 40. When T is 10, it results in 40<40, and $t_2$<T is not satisfied, so that $t_a$ is set to $t_a$=40 and $V_a$ is set to $V_a$=4.8 from FIG. 6 (S912). Then, the next T is retrieved (S910). The next T is 50. Since T is 50, it results in 40<50, and the equation $t_2$<50 is satisfied, so that $t_b$ is set to $t_b$=50 and $V_b$ is set to $V_b$=5.0 (S913).

From the thus obtained $t_a$=40, $V_a$=4.8, $t_b$=50 and $V_b$=5.0, and the equation $V=(V_b-V_a)/(t_b-t_a) \times T + V_a - (V_b 31 V_a)/(t_b-t_a) \times t_a$, V is determined (S914). From this equation, V is calculated to be V=4.8. It is then determined whether the thus determined V=4.8 satisfies the relationship $V_1 \leq V$ for the voltage $V_1$=2.0 (S915). Since 4.8 is greater than 2.0, the relationship $V_1 \leq V$ is satisfied (S915). Accordingly, the V is compared with $V_2$. That is, it is determined whether the relationship $V_2 \geq V$ is satisfied (S916). This results in 7.0≥4.8 and the conditions are satisfied, so that it is determined that the simulation result file 111 and the condition information 502 satisfy the conditions (S917). Additionally, it is examined whether T=20 and T=30, which exist in the period from $t_1$ to $t_2$, satisfy $V_1 \leq V \leq V_2$. Since V=3.7 when T=20, 2.0≤3.7≤7.0 is satisfied. Since V=4.4 when T=30, 2.0≤4.4≤7.0 is satisfied. Since all of the points existing in the period from $t_1$ to $t_2$ are examined in this manner and it is determined that the simulation result file 111 and the condition information 502 satisfy the conditions, "PASS" is displayed with the verification result output means 606 (S917).

It should be noted that when the data $V_1$ and $V_2$ associated with the times $t_1$ and $t_2$ are actually present in the simulation result, it is not necessary to use an approximation equation to calculate the voltage. FIG. 11 shows the flow chart for this case.

Embodiment 2

Figure 19:
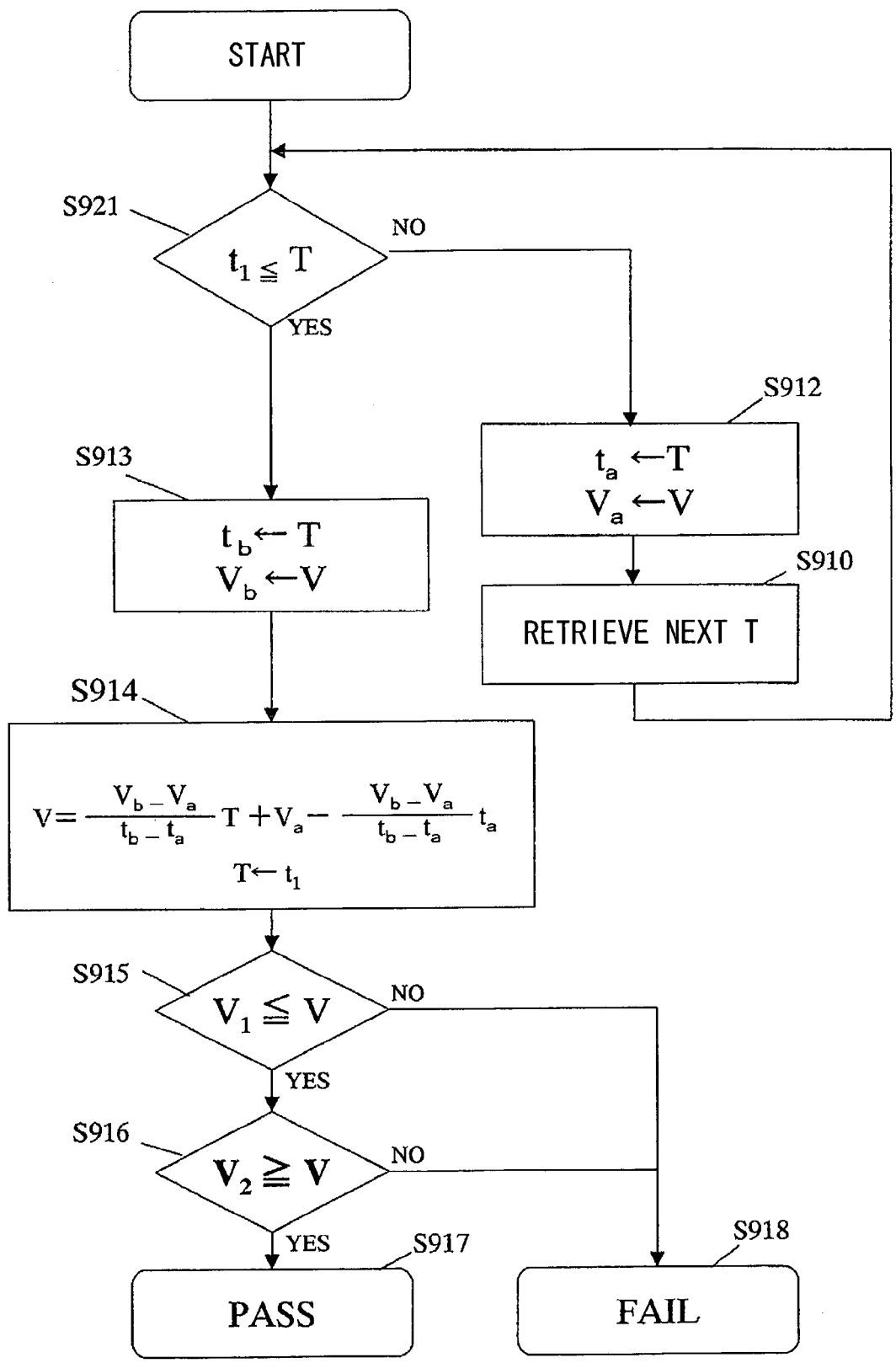
FIG. 19 is a flow chart showing Embodiment 2 of the present invention.
Figure 20:
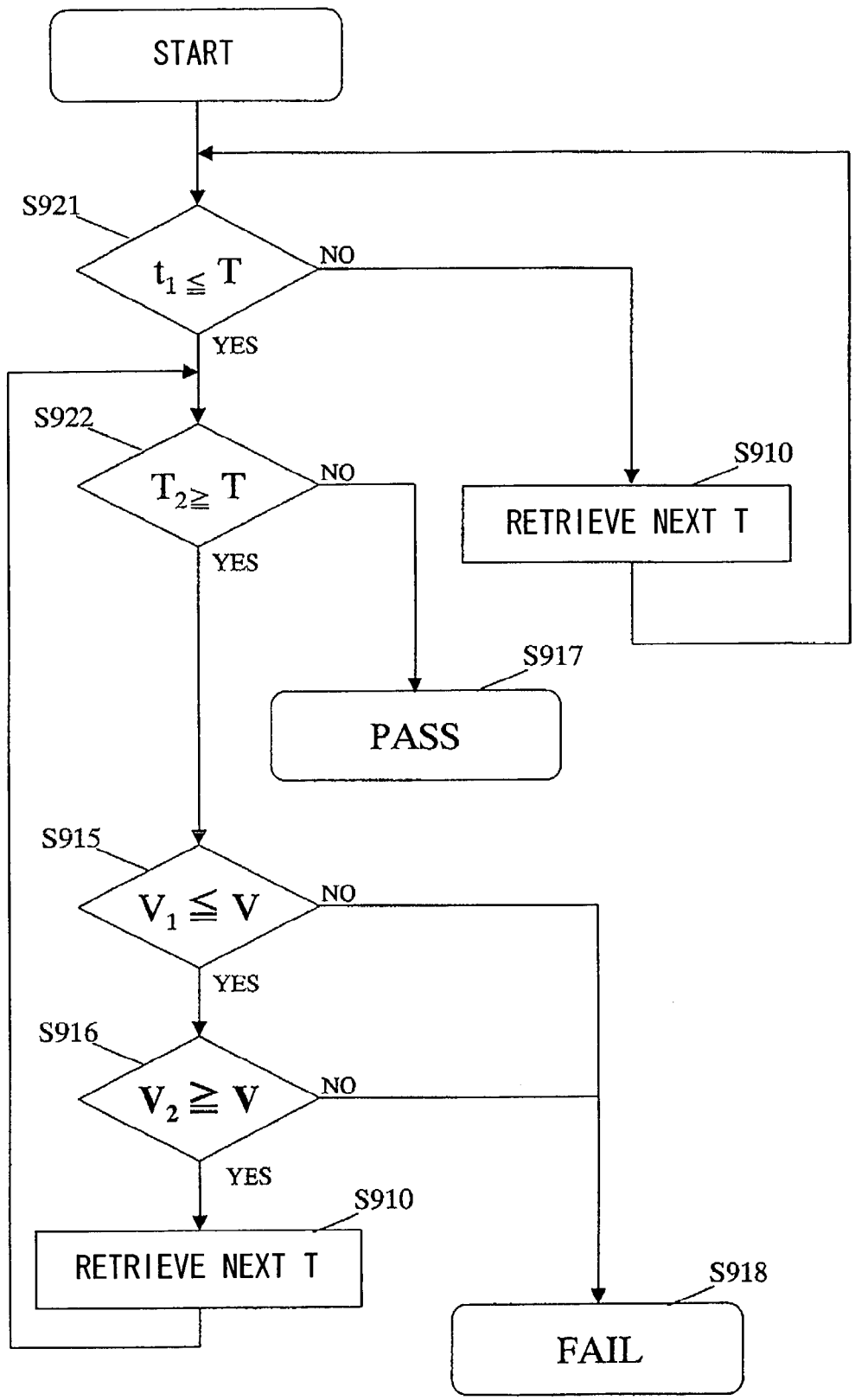
FIG. 20 is a flow chart showing Embodiment 2 of the present invention.

Next, Embodiment 2 of the present invention is described. Embodiment 2 is different from the above-described Embodiment 1 in that the relationship between $t_1$ and T is set to $t_1$"≤"T in S921 shown in FIG. 19 in Embodiment 2. When $t_1$=T is satisfied, the procedure advances from S921 to S913. More specifically, even when $t_1$=T is satisfied, V is calculated from $t_a$, $t_b$, $V_a$ and $V_b$ and the approximation equation to determine whether $V_1 \leq V \leq V_2$ is satisfied, and the result is displayed. That is, even when $t_1$=T is satisfied, there is no path for determining whether $V_1 \leq V \leq V_2$ is satisfied without calculating the approximate value. Additionally, in this embodiment, the relationship between $t_2$ and T in S919 shown in FIG. 10 is set to $t_2$"≤"T. The drawing illustrating this has been omitted. Further, a diagram corresponding to FIG. 11 is shown in FIG. 20. Except for the above-described differences, this embodiment is basically the same as Embodiment 1 unless otherwise explained.

Next, this embodiment is described more specifically by giving actual values. Since the same descriptions as those of Embodiment 1 apply to $t_1$, only $t_2$ is considered, based on FIGS. 18 and 19. T is retrieved successively. When T is 30, it results in 40≤30, and $t_2$≤30 is not satisfied, so that $t_a$ is set to $t_a$=30 and $V_a$ is set to $V_a$=4.4 from FIG. 6. Then, the next T is retrieved. The next T is 40. When T is 40, it results in 40≤40, and $t_2$≤T is satisfied, so that $t_b$ is set to $t_b$=40 and $V_b$ is set to $V_b$=4.8 from FIG. 6.

From the thus obtained $t_a$=30, $V_a$=4.4, $t_b$=40 and $V_b$=4.8, and the equation $V=(V_b-V_a)/(t_b-t_a) \times T + V_a - (V_b-V_a)/(t_b-t_a) \times t_a$, V is determined. From this equation V is calculated to be V=4.8. Next, it is determined whether the condition $V_1 \leq V$ is satisfied. When specific numerical values are assigned to $V_1 \leq V$, it results in 2.0≤4.8, and the conditions are met. Accordingly, V is compared with $V_2$. That is, it is determined whether $V_2 \geq V$ is satisfied. This results in 7.0≤4.8 and the conditions are met, so that it is determined that the simulation result file 111 and the condition information 502 satisfy the conditions. Since it has thus been determined that the simulation result file 111 and the condition information 502 satisfy the conditions, "PASS" is displayed with the verification result output means.

As described above, the same results as those described in Embodiment 1 were obtained. That is to say that the same results are obtained by using either the flow chart shown in FIG. 9 or that shown in FIG. 19.

Embodiment 3

Figure 21:
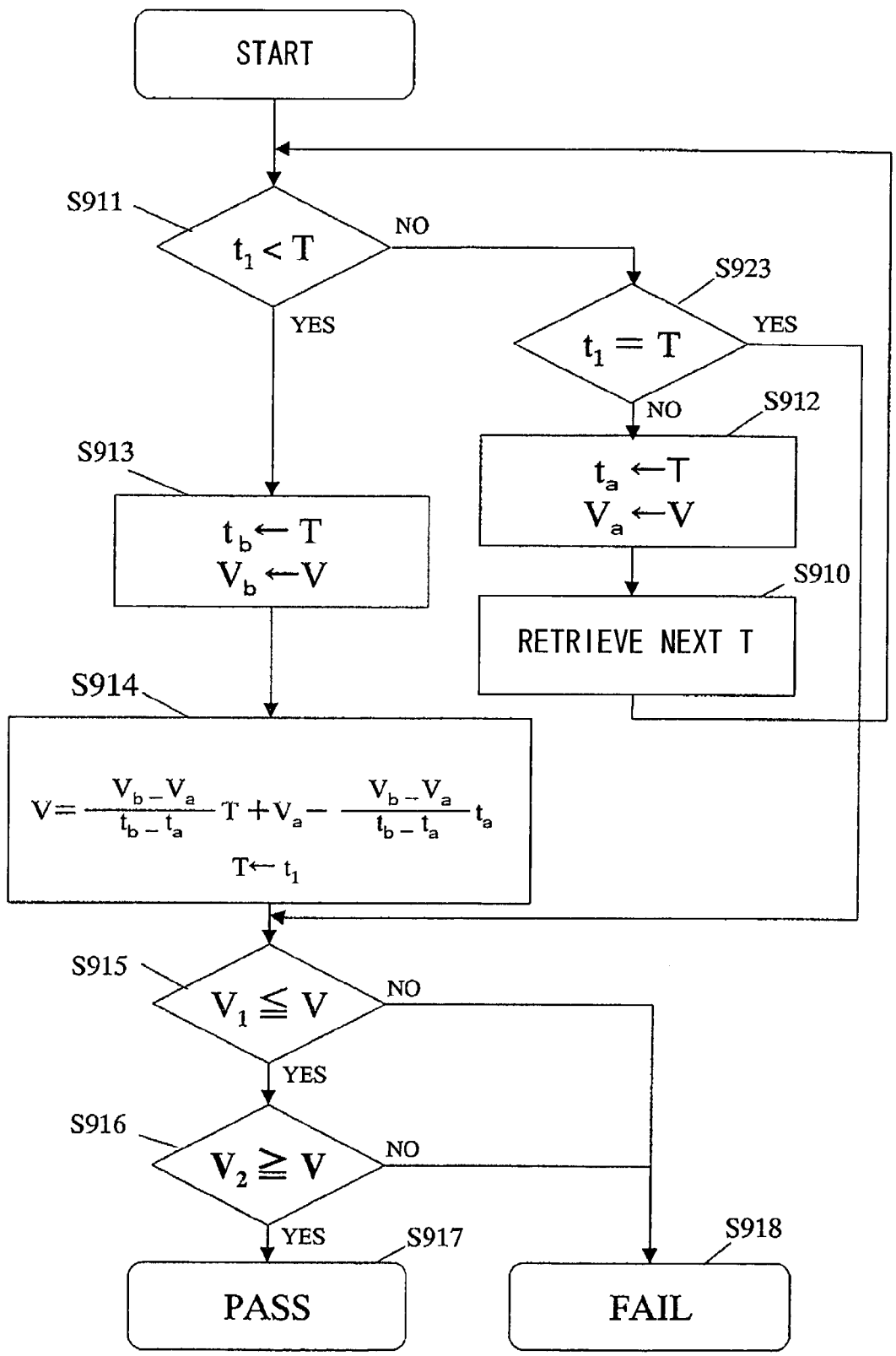
FIG. 21 is a flow chart showing Embodiment 3 of the present invention.

Next, Embodiment 3 of the present invention is described. Embodiment 3 is different from the above-described Embodiment 1 in that Embodiment 3 includes, as shown in FIG. 21, a step to be performed when a given time t and time T of the simulation result are the same, that is, when t=T is satisfied.

Let us consider the case where a given time t is $t_1$. FIG. 21 shows the case where time T is the same as $t_1$, that is, where T=$t_1$. When T=$t_1$, the condition $t_1$<T is not satisfied. Accordingly, when T=$t_1$, T is determined without retrieving any further t. V is also determined once T has been determined, so that the thus determined V is compared with $V_1$ and $V_2$. It is then determined whether voltage V satisfies $V_1 \leq V$. When voltage V does not satisfy $V_1 \leq V$, it is determined that the simulation result file 111 and the condition information 502 do not satisfy the conditions. When it is determined that $V_1 \leq V$ is satisfied, V is compared with $V_2$. When $V_2 \geq V$ is not satisfied, it is determined that the simulation result file 111 and the condition information 502 do not satisfy the conditions. When $V_2 \geq V$ is satisfied, it is determined that the simulation result file 111 and the condition information 502 satisfy the conditions. Except for the above-described differences, this embodiment is basically the same as Embodiment 1 unless otherwise explained.

Here, this embodiment is described more specifically by giving actual values. Reference is made to FIG. 21. Since the same descriptions as those of Embodiment 1 apply to $t_1$, only $t_2$ is considered. T is retrieved successively. When T is 30, it results in 40<30, and $t_2$<30 is not satisfied and $t_2$=t is also not satisfied, so that $t_a$ is set to $t_a$=30 and $V_a$ is set to $V_a$=4.4 from FIG. 6. Then, the next T is retrieved. The next T is 40. When T is 40, it results in 40<40, and the $t_2$<T is not satisfied. Then, $t_2$=T is satisfied, so that from FIG. 6, V is 4.8 when T is 40. It is determined whether the condition $V_1 \leq V$ is satisfied. When specific numerical values are assigned to $V_1 \leq V$, it results in 2.0≤4.8 and the conditions are met. Accordingly, V is compared with $V_2$. That is, it is determined whether $V_2 \leq V$ is satisfied. This results in 7.0≤4.8 and the conditions are met, so that it is determined that the simulation result file 111 and the condition information 502 satisfy the conditions. When it has thus been determined that the simulation result file 111 and the condition information 502 satisfy the conditions, "PASS" is displayed with the verification result output means.

That is, when time T is the same as $t_1$, i.e., when T=$t_1$, T and V for that time T are used, instead of calculating the approximate value from $t_a$, $t_b$, $V_a$ and $V_b$, and the equation $V=(V_b-V_a)/(t_b-t_a) \times T+V_a-(V_b-V_a)/(t_b-t_a) \times t_a$. In other words, when actual value, the actual value is employed. Use of this method eliminates the need to calculate the approximate value, thereby making it possible to obtain results promptly. Nevertheless, the results obtained are the same as those of Embodiment 1.

Embodiment 4

Next, Embodiment 4 of the present invention is described. Embodiment 4 is different from the above-described Embodiment 1 in that Embodiment 4 includes, as shown in FIG. 22, a step to be performed when a given time t and time T of the simulation result are the same, that is, when t=T is satisfied.

Figure 22:
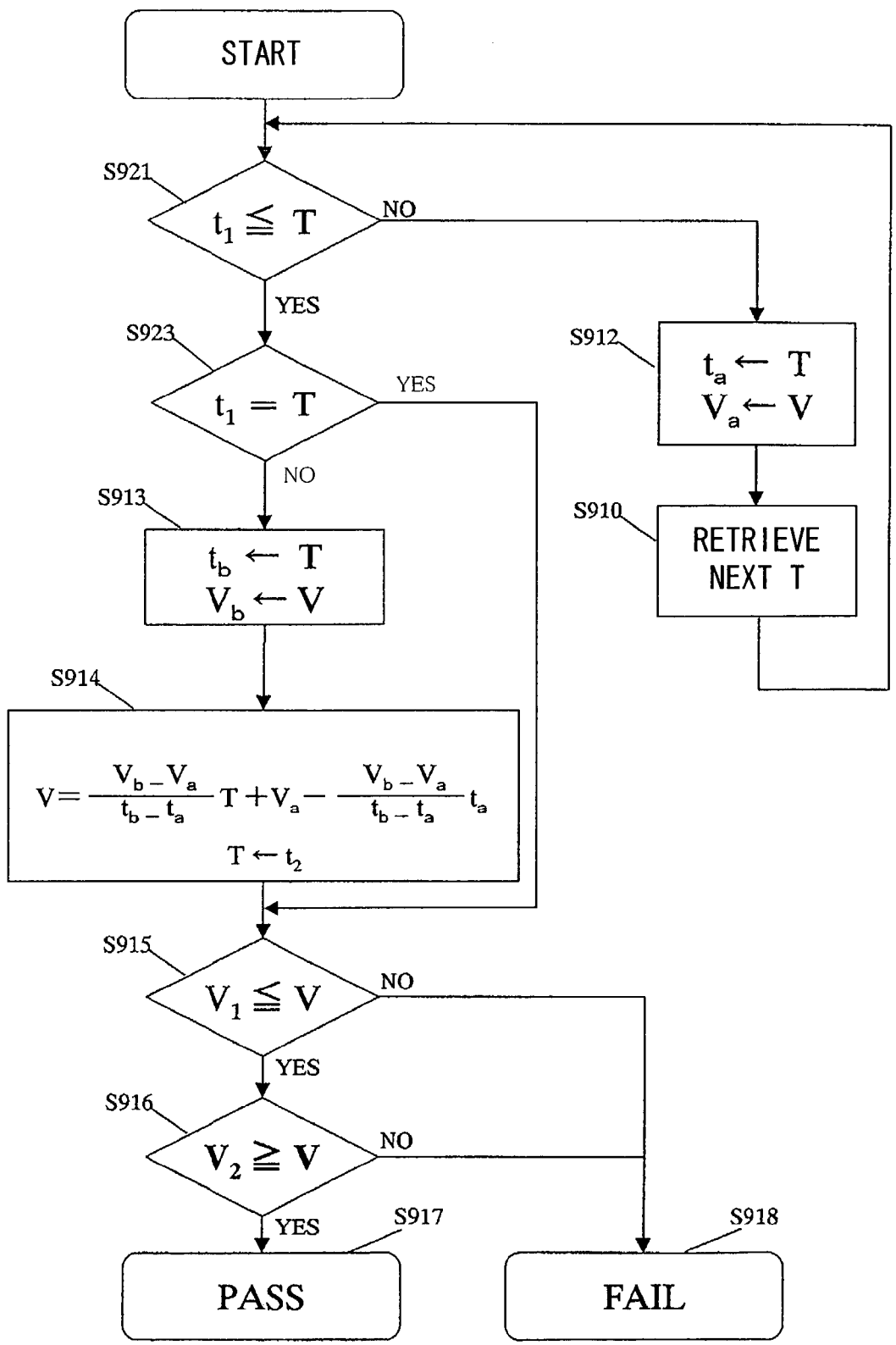
FIG. 22 is a flow chart showing Embodiment 4 of the present invention.

FIG. 22 shows the case where time T is the same as $t_1$, that is, where T=$t_1$, although in a pattern different from that described above. T is retrieved successively, and when $t_1 \leq T$ is not satisfied, $t_a$ is set to T and $V_a$ is set to V, and the next T is retrieved. When $t_1 \leq T$ is satisfied, it is determined whether T is equal to $t_1$. When $t_1$=T is satisfied, T is determined to be $t_1$. Once T has been determined, the V for that T is determined. As in the previous case, when voltage V does not satisfy $V_1 \leq V$, it is determined that the simulation result file 111 and the condition information 502 do not satisfy the conditions. When it is determined that $V_1 \leq V$ is satisfied, V is compared with $V_2$. When $V_2 \geq V$ is not satisfied, it is determined that the simulation result file 111 and the condition information 502 do not satisfy the conditions. When $V_2 \geq V$ is satisfied, it is determined that the simulation result file 111 and the condition information 502 satisfy the conditions.

On the other hand, when $t_1$=T is not satisfied, $t_b$ is set to T and $V_b$ is set to V. The approximate value of voltage V at a given time t is obtained by using the previously determined $t_a$ and $V_a$ and the following equation: $V=(V_b-V_a)/(t_b-t_a) \times T+V_a-(V_b-V_a)/(t_b-t_a) \times t_a$. Then, as shown in FIG. 22, it is determined whether the obtained V is greater than the $V_1$ of the condition information. Here, when $V_1 \leq V$ is not satisfied, the conditions are not met, so that it is determined that the simulation result file 111 and the condition information 502 do not satisfy the conditions. When $V_1 \leq V$ is satisfied, V is further compared with $V_2$ determined by the condition information. When $V_2 \geq V$ is not satisfied, the conditions are not met, so that it is determined that the simulation result file 111 and the condition information 502 do not satisfy the conditions. When it is found that $V_2 \geq V$ is satisfied, it is determined that the simulation result file 111 and the condition information 502 satisfy the conditions. Except for the above-described differences, this embodiment is basically the same as Embodiment 1 unless otherwise explained.

Here, this embodiment is described more specifically by giving actual values. Reference is made to FIG. 22. Since the same descriptions as those of Embodiment 1 apply to $t_1$, only $t_2$ is considered. T is retrieved successively. When T is 30, it results in 40≤30, and $t_2 \leq 30$ is not satisfied, so that $t_a$ is set to $t_a$=30 and $V_a$ is set to $V_a$=4.4 from FIG. 6. Then, the next T is retrieved. The next T is 40. When T is 40, it results in 40≤40, and $t_2 \leq T$ is satisfied. Then, $t_2$=T is satisfied, so that from FIG. 6, V is 4.8 when T is 40. Next, it is determined whether the condition $V_1 \leq V$ is satisfied. When specific numerical values are assigned to $V_1 \leq V$, it results in 2.0≤4.8, and the conditions are met. Accordingly, V is compared with $V_2$. That is, it is determined whether $V_2 \geq V$ is satisfied. This results in 7.0≤4.8 and the conditions are met, so that it is determined that the simulation result file 111 and the condition information 502 satisfy the conditions. When it is determined that the simulation result file 111 and the condition information 502 satisfy the conditions, "PASS" is displayed with the verification result output means 606.

That is, when time T is the same as $t_1$, i.e., when T=$t_1$, T and V for that time T are used, instead of calculating the approximate value from $t_a$, $t_b$, $V_a$ and $V_b$, and the equation $V=(V_b-V_a)/(t_b-t_a) \times T+V_a-(V_b-V_a)/(t_b-t_a) \times t_a$. In other words, when actual value, the actual value is employed. Use of this method eliminates the need to calculate the approximate value, thereby making it possible to obtain results promptly. Nevertheless, the results obtained are the same as those of Embodiment 1.

Embodiment 5

Next, Embodiment 5 of the present invention is described. Embodiment 5 is different from the above-described Embodiment 1 in that "T=$t_1$" is checked first in Embodiment 5, as shown in S923 in FIG. 23. Similarly, "T=$t_2$" is checked first, but the drawing showing this has been omitted. Except for these differences, this embodiment is basically the same as Embodiment 1 unless otherwise explained.

Figure 23:
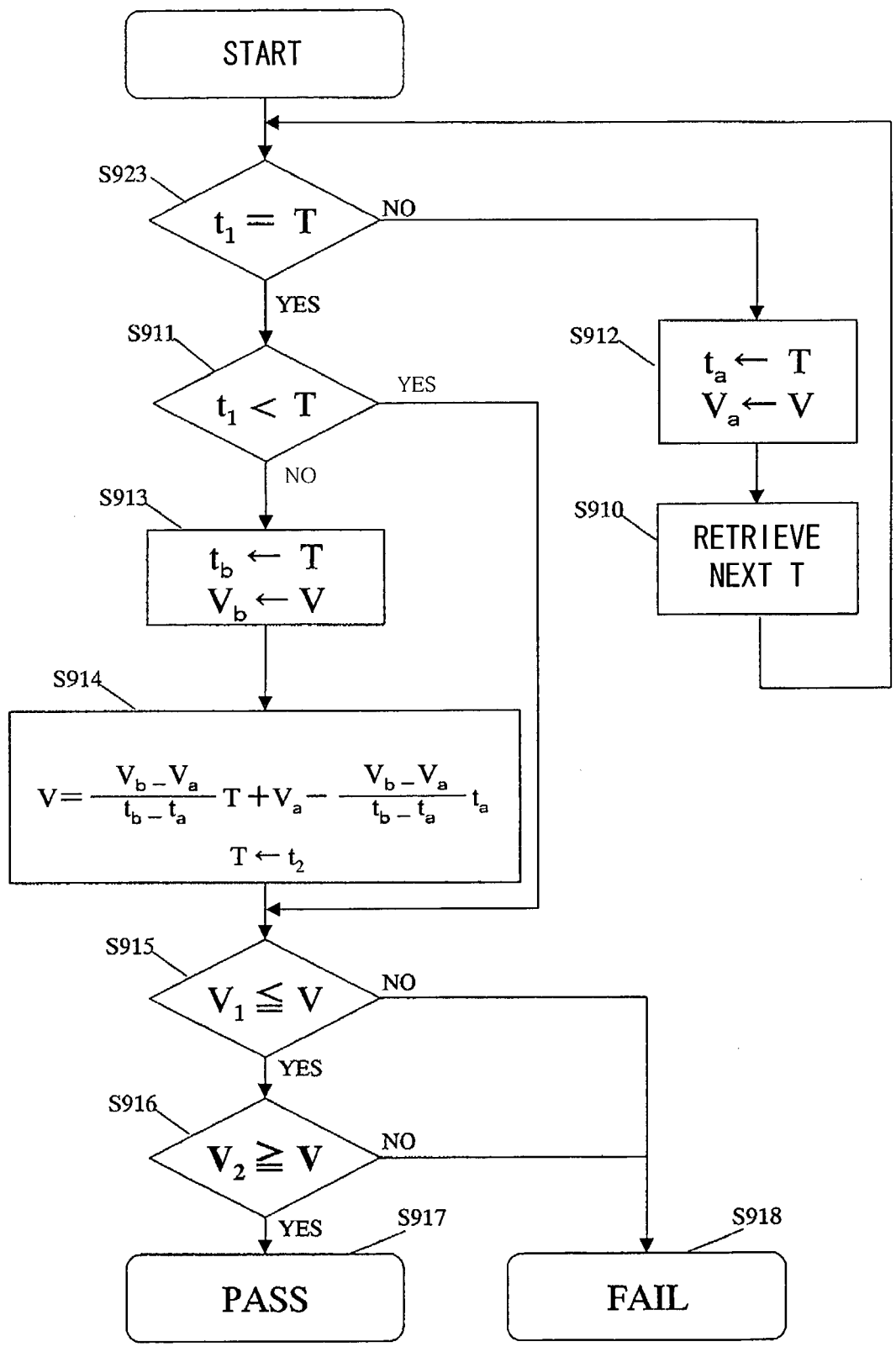
FIG. 23 is a flow chart showing Embodiment 5 of the present invention.
Figure 24:
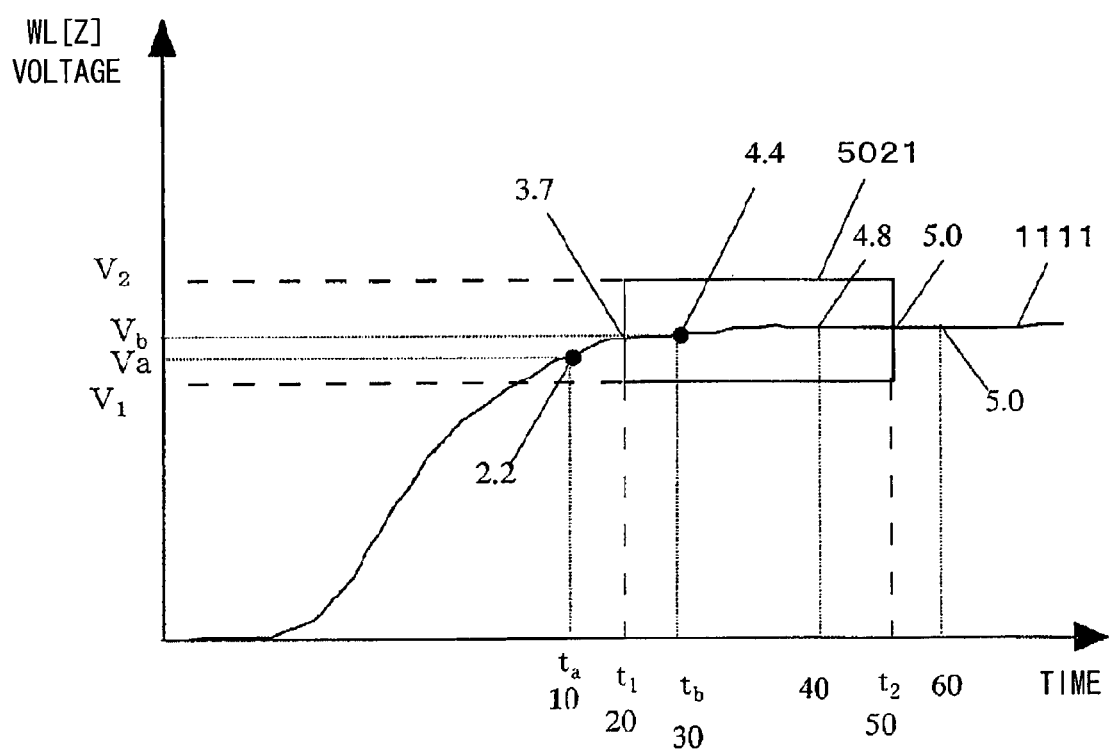
FIG. 24 is a graph showing a comparison of a simulation result with condition information.

This embodiment is described more specifically by giving actual values. Reference is made to FIG. 23. Since the same descriptions as those of Embodiment 1 apply to $t_1$, only $t_2$ is considered. T is retrieved successively. When T is 30, $t_2$=T is not satisfied, so that it is examined whether $t_2$<T is satisfied. This results in 40<30 and $t_2$<30 is not satisfied, so that $t_a$ is set to $t_a$=30 and $V_a$ is set to $V_a$=4.4 from FIG. 6. The next T is retrieved. Then, the next T is 40. When T is 40, $t_2$=T. That is, 40=40 and $t_2$=T is satisfied. From FIG. 6, V is 4.8 when T is 40. Accordingly, it is determined whether the condition $V_1 \leq V$ is satisfied. When specific numerical values are assigned to $V_1 \leq V$, it results in $2.0 \leq 4.8$ and the conditions are met. Therefore, V is compared with $V_2$. That is, it is determined whether $V_2 \geq V$ is satisfied. This results in $7.0 \geq 4.8$ and the conditions are met, so that it is determined that the simulation result file 111 and the condition information 502 satisfy the conditions. When it is determined that the simulation result file 111 and the condition information 502 satisfy the conditions, "PASS" is displayed with the verification result output means 606.

That is, when time T is the same as $t_1$ or $t_2$, i.e., when T=$t_1$ or $t_2$, T and V for that time T are used, instead of calculating the approximate value from $t_a$, $t_b$, $V_a$ and $V_b$, and the equation $V=(V_b-V_a)/(t_b-t_a)\times T + V_a - (V_b-V_a)/(t_b-t_a)\times t_a$. In other words, when there is an actual value, the actual value is employed. Use of this method eliminates the need to calculate the approximate value, thereby making it possible to obtain results promptly. Nevertheless, the results obtained are the same as those of Embodiment 1.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A simulation result verification method used for LSI designing, wherein based on:
    a simulation result that is obtained by simulating a LSI design data and that represents a relationship between a time and an output state at each of a plurality of nodes of a semiconductor integrated circuit, and
    condition information specifying a condition for the output state in a period between times t1 and t2 of one of said plurality of nodes,
    determining whether the output state in the period between the times t1 and t2 of the one node in the simulation result agrees with the output state according to the condition information,
    wherein the given time t in the simulation result is any time within the period between the times t1 and t2 in the simulation result, the output state is a voltage, and the voltage at the given time t is determined by V=(Vb−Va)/(tb−ta)×t+Va−(Vb−Va)/(tb−ta) ×ta, and
    wherein the time ta is before the time t and the time tb is after the time t, and Va is the voltage of the output state at time ta, and Vb is the voltage of the output state at time tb.

2. A simulation result verification method used for LSI designing, wherein based on:
    a simulation result that is obtained by simulating a LSI design data and that represents a relationship between a time and an output state at each of a plurality of nodes of a semiconductor integrated circuit, and
    condition information specifying a condition for the output state in a period between times t1 and t2 of one of said plurality of nodes,
    determining whether the output state in the period between the times t1 and t2 of the one node in the simulation result agrees with the output state according to the condition information,
    wherein the given time t in the simulation result is any time within the period between the times t1 and t2 in the simulation result, the output state is a voltage, the voltage at a given time t in the simulation result is determined from times ta and tb, which are actually present in the simulation result, and the time ta is before the time t and the time tb is after the time t, and Va is the voltage of the output state at time ta, and Vb is the voltage of the output state at at time tb, and
    wherein the voltage at the given time t is determined by V=(Vb−Va)/(tb−ta)×t+Va −(Vb−Va)/(tb−ta)×ta.

3. A simulation result verification device used for LSI designing wherein, based on:
    a simulation result that is obtained by simulating a LSI design data and that represents a relationship between a time and an output state at each of a plurality of nodes of a semiconductor integrated circuit, and
    condition information specifying a condition for the output state in a period between times t1 and t2 of one of said plurality of nodes,
    determining whether the output state in the period between the times t1 and t2 of the one node in the simulation result agrees with the output state according to the condition information,
    wherein the output state is a voltage, the voltage at a given time t in the simulation result is determined from times ta and tb, which are actually present in the simulation result, and the time ta is before the time t and the time tb is after the time t, and Va is the voltage of the output state at time ta, and Vb is the voltage of the output state at time tb, and
    wherein the voltage at the given time t is determined by V=(Vb−Va)/(tb−ta)×t+Va −(Vb−Va)/(tb−ta)×ta.

* * * * *

UNITED STATES PATENT AND TRADEMARK OFFICE
CERTIFICATE OF CORRECTION

| | |
|---|---|
| PATENT NO. | : 7,043,707 B2 |
| APPLICATION NO. | : 10/455308 |
| DATED | : May 9, 2006 |
| INVENTOR(S) | : Naohisa Tatsukawa |

Page 1 of 1

It is certified that error appears in the above-identified patent and that said Letters Patent is hereby corrected as shown below:

TITLE PAGE,
Item "(75) Inventor:", change "Naohisa Takatsuki" to -- Naohisa Tatsukawa --.

Signed and Sealed this

Twenty-first Day of November, 2006

JON W. DUDAS
*Director of the United States Patent and Trademark Office*